US011996392B2

(12) United States Patent
Do et al.

(10) Patent No.: US 11,996,392 B2
(45) Date of Patent: May 28, 2024

(54) SEMICONDUCTOR PACKAGE INCLUDING STACKED SEMICONDUCTOR CHIPS

(71) Applicant: SK hynix Inc., Icheon-si Gyeonggi-do (KR)

(72) Inventors: Eun Hye Do, Icheon-si Gyeonggi-do (KR); Jong Hoon Kim, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/304,106

(22) Filed: Apr. 20, 2023

(65) Prior Publication Data

US 2023/0253371 A1    Aug. 10, 2023

Related U.S. Application Data

(63) Continuation of application No. 17/157,648, filed on Jan. 25, 2021, now Pat. No. 11,664,351.

(30) Foreign Application Priority Data

Aug. 18, 2020    (KR) ........................ 10-2020-0103152

(51) Int. Cl.
*H01L 25/065*    (2023.01)

(52) U.S. Cl.
CPC *H01L 25/0657* (2013.01); *H01L 2225/06506* (2013.01); *H01L 2225/06651* (2013.01); *H01L 2225/06562* (2013.01); *H01L 2225/06586* (2013.01)

(58) Field of Classification Search
CPC ....... H01L 25/0657; H01L 2225/06506; H01L 2225/0651; H01L 2225/06562; H01L 2225/06586; H10B 80/00
See application file for complete search history.

(56) References Cited

U.S. PATENT DOCUMENTS

| | | |
|---|---|---|
| 10,128,211 B2 | 11/2018 | Chang et al. |
| 11,133,288 B2 | 9/2021 | Kim |
| 2019/0067248 A1 | 2/2019 | Yoo et al. |
| 2021/0202415 A1 | 7/2021 | Kim et al. |

FOREIGN PATENT DOCUMENTS

KR    1020150078875 A    7/2015

*Primary Examiner* — Timor Karimy
(74) *Attorney, Agent, or Firm* — WILLIAM PARK & ASSOCIATES LTD.

(57) ABSTRACT

A semiconductor package includes: semiconductor chips being offset-stacked to expose edge regions adjacent to first side surfaces; chip pads disposed in each of the edge regions of the semiconductor chips, the chip pads including a plurality of first chip pads arranged in a first column and a plurality of second chip pads arranged in a second column; a horizontal common interconnector having one end connected to the second chip pad of a semiconductor chip of the semiconductor chips, and another end connected to the first chip pad of another semiconductor chip; and a vertical common interconnector having one end connected to the second chip pad of the uppermost semiconductor chip, which is electrically connected to the first chip pad of the uppermost semiconductor chip connected to the horizontal common interconnector.

11 Claims, 18 Drawing Sheets

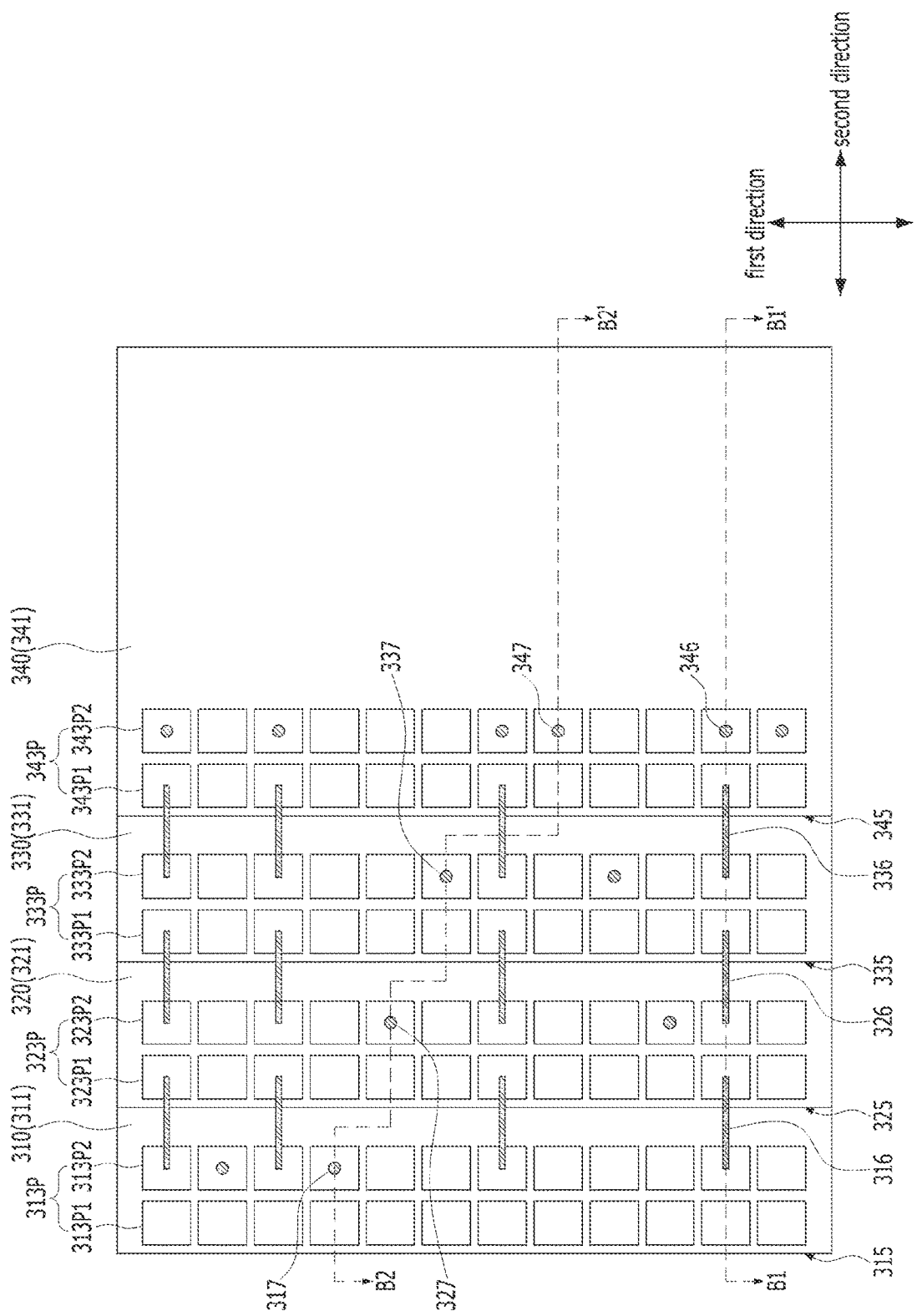

SEMICONDUCTOR PACKAGE INCLUDING STACKED SEMICONDUCTOR CHIPS

CROSS-REFERENCE TO RELATED APPLICATION

This application is a continuation application of U.S. patent application Ser. No. 17/157,648, filed on Jan. 25, 2021, and claims priority under 35 U.S.C. § 119(a) to Korean Patent Application No. 10-2020-0103152 filed on Aug. 18, 2020, which is incorporated herein by reference in its entirety.

BACKGROUND

1. Technical Field

This patent document relates to a semiconductor package, and more particularly, to a semiconductor package in which a plurality of semiconductor chips are stacked.

2. Related Art

Electronic products require high-volume data processing while the sizes of these products become smaller. Accordingly, there is a growing need to increase the degree of integration of semiconductor devices used in such electronic products.

However, due to the limitations of semiconductor integration technology, it is difficult to satisfy a required function with only a single semiconductor chip, and thus a semiconductor package in which a plurality of semiconductor chips are embedded therein has been manufactured.

SUMMARY

In an embodiment, a semiconductor package may include: first to Nth semiconductor chips having first side surfaces which extend in a first direction, and being offset-stacked toward substantially an opposite side of the first side surfaces to expose edge regions adjacent to the first side surfaces, where N is a natural number of 2 or more; chip pads disposed in each of the edge regions of the first to Nth semiconductor chips, the chip pads including a plurality of first chip pads arranged in a first column along the first direction and a plurality of second chip pads arranged in a second column along the first direction, the first column being closer to the first side surface than the second column in a second direction crossing the first direction, and the first and second chip pads which are adjacent in the second direction being electrically connected to each other; a horizontal common interconnector having one end connected to the second chip pad of a kth semiconductor chip of the first to Nth semiconductor chips, and an other end connected to the first chip pad of a k+1th semiconductor chip, where k is a natural number of 1 or more and N−1 or less; and a vertical common interconnector having one end connected to the second chip pad of the Nth semiconductor chip, which is electrically connected to the first chip pad of the Nth semiconductor chip connected to the horizontal common interconnector.

In another embodiment, a semiconductor package may include: a first chip stack including first to Nth semiconductor chips which have first side surfaces extending in a first direction, and are offset-stacked toward an opposite side of the first side surfaces of the first to Nth semiconductor chips to expose edge regions adjacent to the first side surfaces of the first to Nth semiconductor chips, where N is a natural number of 2 or more; a second chip stack formed over the first chip stack and including N+1th to Tth semiconductor chips which have first side surfaces located substantially opposite to the first side surfaces of the first to Nth semiconductor chips, and are offset-stacked in a direction substantially opposite to an offset stacking direction of the first to Nth semiconductor chips to expose edge regions adjacent to the first side surfaces of the N+1th to Tth semiconductor chips, where T is a natural number of N+2 or more; chip pads disposed in each of the edge regions of the first to Tth semiconductor chips, the chip pads including a plurality of first chip pads arranged in a first column along the first direction and a plurality of second chip pads arranged in a second column along the first direction, the first column being closer to the first side surface than the second column in a second direction crossing the first direction, and the first and second chip pads which are adjacent in the second direction being electrically connected to each other; a first horizontal common interconnector having one end connected to the second chip pad of a kth semiconductor chip of the first to Nth semiconductor chips, and an other end connected to the first chip pad of a k+1th semiconductor chip, where k is a natural number of 1 or more and N−1 or less; a second horizontal common interconnector having one end connected to the second chip pad of a qth semiconductor chip of the N+1th to Tth semiconductor chips, and an other end connected to the first chip pad of a q+1th semiconductor chip, where q is a natural number of N+1 or more and T−1 or less; a first vertical common interconnector having one end connected to the second chip pad of the Nth semiconductor chip, which is electrically connected to the first chip pad of the Nth semiconductor chip connected to the first horizontal common interconnector; and a second vertical common interconnector having one end connected to the second chip pad of the Tth semiconductor chip, which is electrically connected to the first chip pad of the Tth semiconductor chip connected to the second horizontal common interconnector.

BRIEF DESCRIPTION OF THE DRAWINGS

FIG. 6A is a plan view of the semiconductor package according to another embodiment of the present disclosure as viewed from an active surface direction.

DETAILED DESCRIPTION

Figure 1A:
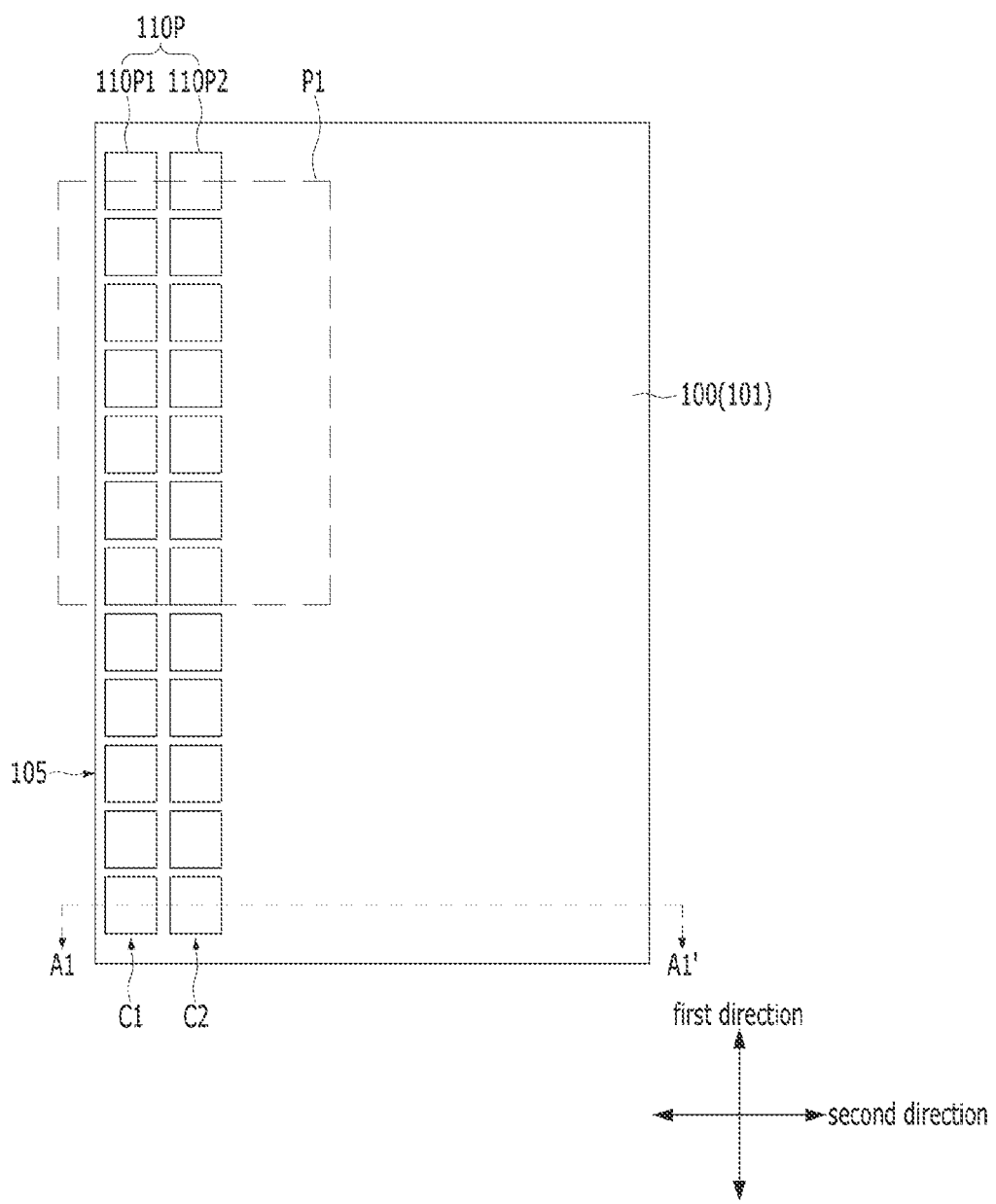
FIG. 1A is a plan view illustrating an active surface of a semiconductor chip according to an embodiment of the present disclosure.

Hereinafter, various embodiments of the disclosure will be described with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Prior to describing a semiconductor package of the present embodiment and a method for fabricating the semiconductor package, a semiconductor chip included in the semiconductor package of the present embodiment will be described first.

Figure 1B:
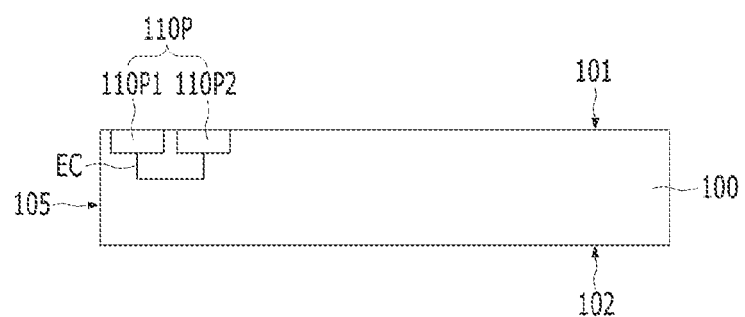
FIG. 1B is a cross-sectional view taken along a line A1-A1' of FIG. 1A.

FIG. 1A is a plan view illustrating an active surface of a semiconductor chip according to an embodiment of the present disclosure, and FIG. 1B is a cross-sectional view taken along a line A1-A1' of FIG. 1A.

Referring to FIGS. 1A and 1B, a semiconductor chip 100 of the present embodiment may include an active surface 101 on which chip pads 110P are disposed, an inactive surface 102 located opposite to the active surface 101, and side surfaces connecting the active surface 101 and the inactive surface 102. In the present embodiment, the semiconductor chip 100 may have a rectangular shape having four side surfaces in a plan view. Among the four side surfaces, a side surface adjacent to the chip pads 110P will be referred to as a first side surface 105. As an example, the first side surface 105 may correspond to a left side surface in a second direction.

The chip pads 110P may be electrically conductive elements or terminals exposed from the active surface 101 of the semiconductor chip 100 while being electrically connected to a circuit and/or wiring structure (not shown) of the semiconductor chip 100. For reference, the circuit and/or wiring structure of the semiconductor chip 100 may be variously implemented according to a function and/or type of the semiconductor chip 100. The semiconductor chip 100 may be a nonvolatile memory chip including a NAND flash memory, a phase-change random-access memory (PRAM), a magneto-resistive random-access memory (MRAM), or the like. Alternatively, the semiconductor chip 100 may be a volatile memory including a dynamic random-access memory (DRAM), a static random-access memory (SRAM), or the like. However, the present disclosure is not limited thereto, and the semiconductor chip 100 may be a non-memory chip such as a logic chip.

The chip pads 110P may be disposed in an edge region adjacent to the first side surface 105 of the semiconductor chip 100. That is, the chip pads 110P may be disposed in an edge-pad type. When a plurality of chip pads 110P arranged in a line along the first side surface 105 in a first direction are referred to as a column of chip pads 110P, two columns of chip pads 110P may be disposed in the an edge region adjacent to the first side surface 105 of the semiconductor chip 100. The column of chip pads 110P relatively closer to the first side surface 105 than the other column will be referred to as a first column C1, and the column of chip pads 110P relatively further from the first side surface 105 than the other column will be referred to as a second column C2. In addition, each of the chip pads 110P included in the first column C1 will be referred to as a first chip pad 110P1, and each of the chip pads 110P included in the second column C2 will be referred to as a second chip pad 110P2.

As an example, the first chip pad 110P1 may be a pad for evaluating characteristics of the semiconductor chip 100, and the second chip pad 110P2 may be a pad for electrically connecting the semiconductor chip 100 with other components. To this end, a probe may contact the first chip pad 110P1. In addition, a conductive interconnector such as a wire may be connected to the second chip pad 110P2. However, the present disclosure is not limited thereto, and the second chip pad 110P2 may be used to evaluate the characteristics of the semiconductor chip 100 and the first chip pad 110P1 may be used for electrical connection. Alternatively, the first chip pad 110P1 or the second chip pad 110P2 may be used for characteristic evaluation and also used for electrical connection. That is, after a probe test is performed on the first chip pad 110P1 or the second chip pad 110P2, the conductive interconnector may be connected to the first chip pad 110P1 or the second chip pad 110P2 on which the probe test is performed.

The first chip pad 110P1 and the second chip pad 110P2 adjacent to each other in the second direction may be electrically connected to each other. The first and second chip pads 110P1 and 110P2 adjacent to each other in the second direction will hereinafter be referred to as a pair of first and second chip pads 110P1 and 110P2. In the cross-sectional view of FIG. 1B, the electrical connection between the pair of first and second chip pads 110P1 and 110P2 is shown as a line (refer to EC), but this is for simply expressing the electrical connection function, and the line EC might not show an actual wiring. The electrical connection between the pair of first and second chip pads 110P1 and 110P2 may be made in various ways. As an example, the pair of first and second chip pads 110P1 and 110P2 may be connected to each other using a conductive layer disposed at an uppermost portion of the semiconductor chip 100. This will be, for example, described with reference to FIGS. 2A and 2B below. For reference, the uppermost portion of the semiconductor chip 100 may mean a portion closest to the active surface 101 of the semiconductor chip 100 in a direction parallel to the side surfaces of the semiconductor chip 100.

Figure 2A:
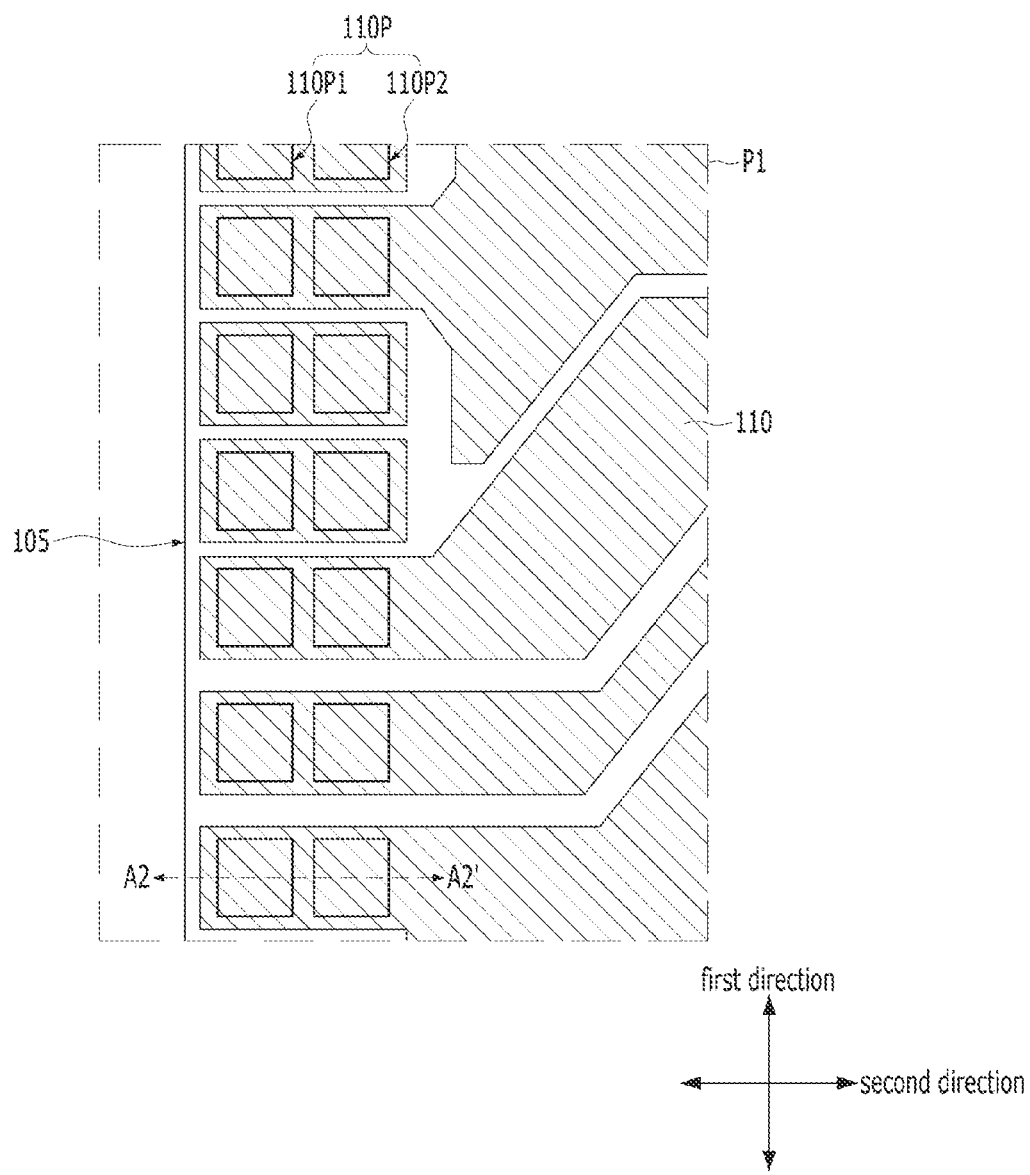
FIG. 2A is a plan view illustrating an example of the conductive layer positioned at the uppermost portion of the semiconductor chip of FIGS. 1A and 1B.
Figure 2B:
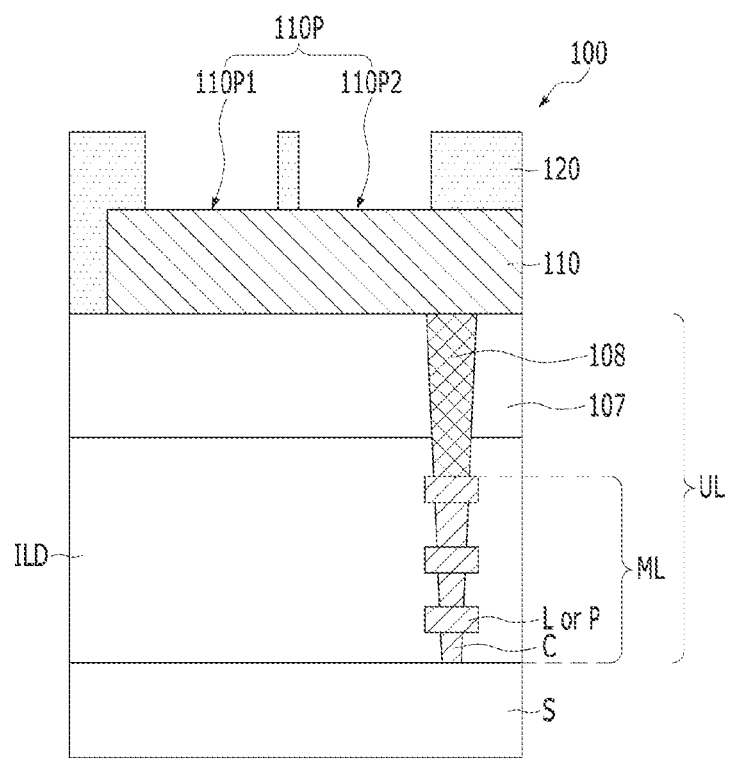
FIG. 2B is a cross-sectional view taken along a line A2-A2' of FIG. 2A.

FIG. 2A is a plan view illustrating an example of the conductive layer positioned at the uppermost portion of the semiconductor chip of FIGS. 1A and 1B. FIG. 2A shows an example of a portion corresponding to a portion P1 of FIG. 1A. FIG. 2B is a cross-sectional view taken along a line A2-A2' of FIG. 2A. In FIGS. 2A and 2B, the conductive layer positioned at the uppermost portion of the semiconductor chip may be, for example, a redistribution conductive layer 110. FIG. 2A is a plan view illustrated at a height of an upper surface of the redistribution conductive layer 110 of FIG. 2B, and for convenience of description, the chip pads 110P are also shown. FIG. 2B further shows a configuration of the semiconductor chip 100 together with the redistribution conductive layer 110.

Referring to FIGS. 2A and 2B, the semiconductor chip 100 of the present embodiment may include a lower structure UL, the redistribution conductive layer 110 formed over the lower structure UL, and a protective layer 120 covering the lower structure UL and the redistribution conductive layer 110 while exposing a part of the redistribution conductive layer 110. The part of the redistribution conductive layer 110, which is exposed by the protective layer 120, may be a redistribution pad. The redistribution pad may form the above-described chip pad 110P.

The lower structure UL may include a semiconductor substrate S including a semiconductor material such as silicon, a multi-layered conductive pattern ML formed over an upper surface of the semiconductor substrate S to constitute an integrated circuit, and an interlayer insulating layer ILD in which the multi-layered conductive pattern ML is buried. Although not shown, the interlayer insulating layer ILD may also have a multi-layered structure.

The multi-layered conductive pattern ML may include a plurality of conductors which are arranged in multiple layers in a direction perpendicular to the upper surface of the semiconductor substrate S and have various shapes. For example, the multi-layered conductive pattern ML may include a combination of a line L or a pad P, and a contact plug C. The line L or the pad P may be located at different layers in a vertical direction, and the contact plug C may connect the line L or the pad P to each other in the vertical direction. The multi-layered conductive pattern ML may be connected to a part of the semiconductor substrate S, for example, a junction of a transistor.

The materials forming the multi-layered conductive pattern ML and the interlayer insulating layer ILD may be appropriately selected in order to satisfy the required characteristics of the semiconductor chip 100. As an example, at least a portion of the multi-layered conductive pattern ML may include a metal having a low resistance such as copper (Cu), and at least a portion of the interlayer insulating layer ILD may include a material having a low dielectric constant such as a low-k material having a low dielectric constant of 2.7 or less. However, if a semiconductor chip is covered with a protective layer and packaged by fab-out in a state in which the multi-layered conductive pattern ML and the interlayer insulating layer ILD are formed, moisture may penetrate through the low-k material that is relatively vulnerable to moisture absorption. The moisture may cause electrical movement of metal ions, particularly copper ions, resulting in loss of the multi-layered conductive pattern ML or electrical shorts with other adjacent conductors. Therefore, in the first semiconductor chip 100 of the present embodiment, it may be intended to prevent the penetration of the moisture by further forming a thick insulating layer 107 over the interlayer insulating layer ILD.

The insulating layer 107 may include an insulating material having a higher dielectric constant and/or a lower moisture absorption rate than the low-k material. For example, the insulating layer 107 may include silicon oxide, silicon nitride, or a combination thereof. In addition, the insulating layer 107 may have a single-layered structure or a multi-layered structure. The insulating layer 107 may be formed relatively thick to prevent the moisture penetration. Specifically, the insulating layer 107 may be thicker than any one layer of the interlayer insulating layer ILD having a multi-layered structure. For example, the insulating layer 107 may have a thickness of tens of thousands of Å.

However, because it is necessary to connect the multi-layered conductive pattern ML to the outside, a contact plug 108 that penetrates the insulating layer 107 to connect with the multi-layered conductive pattern ML, and a redistribution conductive layer 110 that is formed over the insulating layer 107 to connect with the contact plug 108, may be further formed. For convenience of description, in the present disclosure, the insulating layer 107 and the contact plug 108 are also included in the lower structure UL.

The redistribution conductive layer 110 may include various conductive materials, for example, a metal such as aluminum (Al), and may have a single-layered structure or a multi-layered structure. In addition, the redistribution conductive layer 110 may be formed to be relatively thick for smooth signal transmission and balance with the insulating layer 107. The redistribution conductive layer 110 may have a thickness the same as or similar to the thickness of the insulating layer 107. For example, the redistribution conductive layer 110 may have a thickness of tens of thousands of Å.

The protective layer 120 may be disposed over the redistribution conductive layer 110. The protective layer 120 may function to define the chip pad 110P while protecting the first semiconductor chip 100. The protective layer 120 may have a single-layered structure or a multi-layered structure including various insulating materials such as an insulating polymer. In particular, the protective layer 120 may include a polyimide material such as PIQ (Polyimide Isoindro Quindzoline).

All of a process of forming the lower structure UL, a process of forming the redistribution conductive layer 110, and a process of forming the protective layer 120, may be performed before the fab-out, that is, in a front-end process. As an example, the lower structure UL and the redistribution conductive layer 110 may be formed by repeating a process of depositing a conductive material or an insulating material, and patterning the conductive material or the insulating material by a mask and etching process. The protective layer 120 may be formed by a coating method.

In a plan view, the redistribution conductive layer 110 may have various shapes according to patterning. As a part of the redistribution conductive layer 110, the chip pads 110P may be arranged in two columns in the edge region adjacent to the first side surface 105 of the semiconductor chip 100, and may include the first column of first chip pads 110P1 and the second column of second chip pads 110P2, as described above. At this time, the first and second chip pads 110P1 and 110P2 adjacent to each other in the second direction, that is, the pair of first and second chip pads 110P1 and 110P2 may be connected to each other using the redistribution conductive layer 110. The redistribution conductive layer 110 may overlap the pair of first and second chip pads 110P1 and 110P2 at the same time. Furthermore, the redistribution conductive layer 110 may extend in a direction away from the first side surface 105 while overlapping the pair of first and second chip pads 110P1 and 110P2 at the same time. The extension portion of the redistribution conductive layer 110 may have various curved line shapes, plate shapes, or a combination thereof as necessary. In these figures, the redistribution conductive layer 110 overlapping any pair of first and second chip pads 110P1 and 110P2 may be separated from the redistribution conductive layer 110 overlapping another pair of first and second chip pads 110P1 and 110P2. However, although not shown, if necessary, the extension portion of the redistribution conductive layer 110 overlapping any pair of first and second chip pads 110P1 and 110P2 may be connected to the extension portion of the redistribution conductive layer 110 overlapping another pair of first and second chip pads 110P1 and 110P2. As an example, when the same power is applied to one pair of first and second chip pads 110P1 and 110P2 and another pair of first and second chip pads 110P1 and 110P2, the connection of the extension portions may form a PDN (Power Distribution Network), and thus, it may be possible to supply power stably.

In the embodiment of FIGS. 2A and 2B described above, the redistribution conductive layer 110 formed before the fab-out may be the conductive layer positioned at the uppermost portion of the semiconductor chip 100, and the redistribution pad of the redistribution conductive layer 110 may form the chip pad 110P of the semiconductor chip 100. However, the present disclosure is not limited thereto. As long as the chip pads 110P of the semiconductor chip 100 are arranged in two columns in the edge region of the semiconductor chip 100, and a pair of chip pads 110P, which belong to different columns and are adjacent to each other, are connected to each other using the conductive layer positioned at the uppermost portion of the semiconductor chip 100 or other methods, it may be possible to form the semiconductor package of the present embodiment.

Meanwhile, a plurality of semiconductor chips 100 may be stacked in a vertical direction to form a semiconductor package. This will be described with reference to FIGS. 3A to 4C below.

Figure 3A:
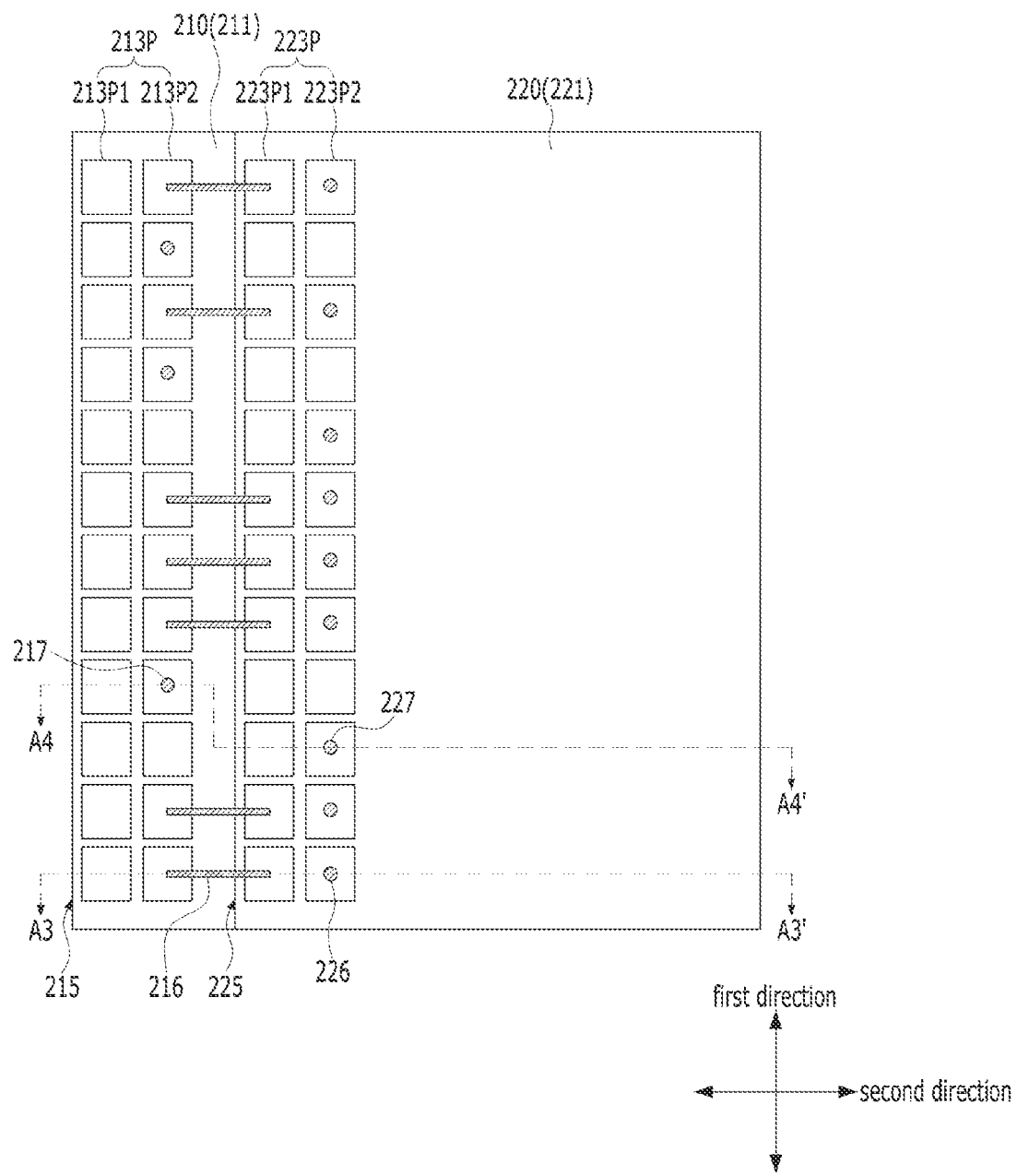
FIGS. 3A and 4A are plan views of the semiconductor package according to the embodiment of the present disclosure as viewed from an active surface direction.
Figure 3B:
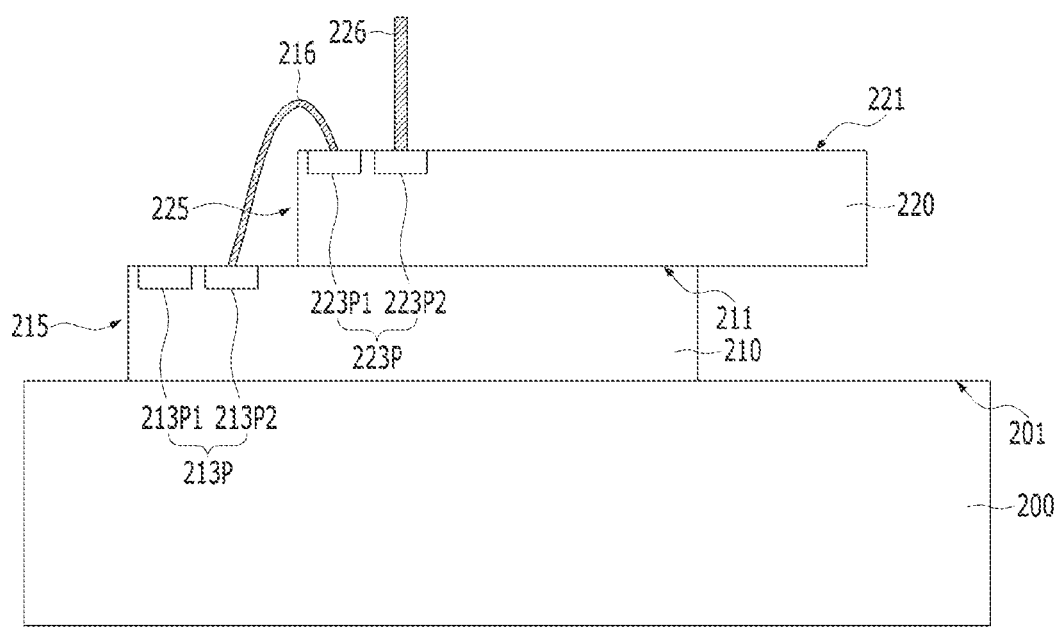
FIGS. 3B and 4B are cross-sectional views taken along a line A3-A3' of FIGS. 3A and 4A, respectively.
Figure 3C:
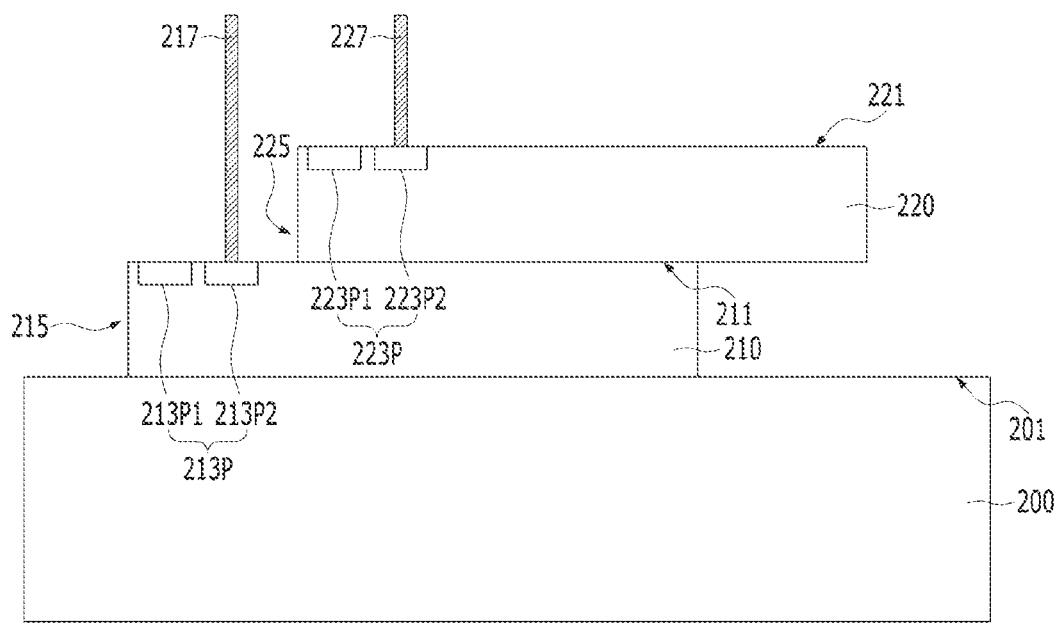
FIGS. 3C and 4C are cross-sectional views taken along a line A4-A4' of FIGS. 3A and 4A, respectively.
Figure 4A:
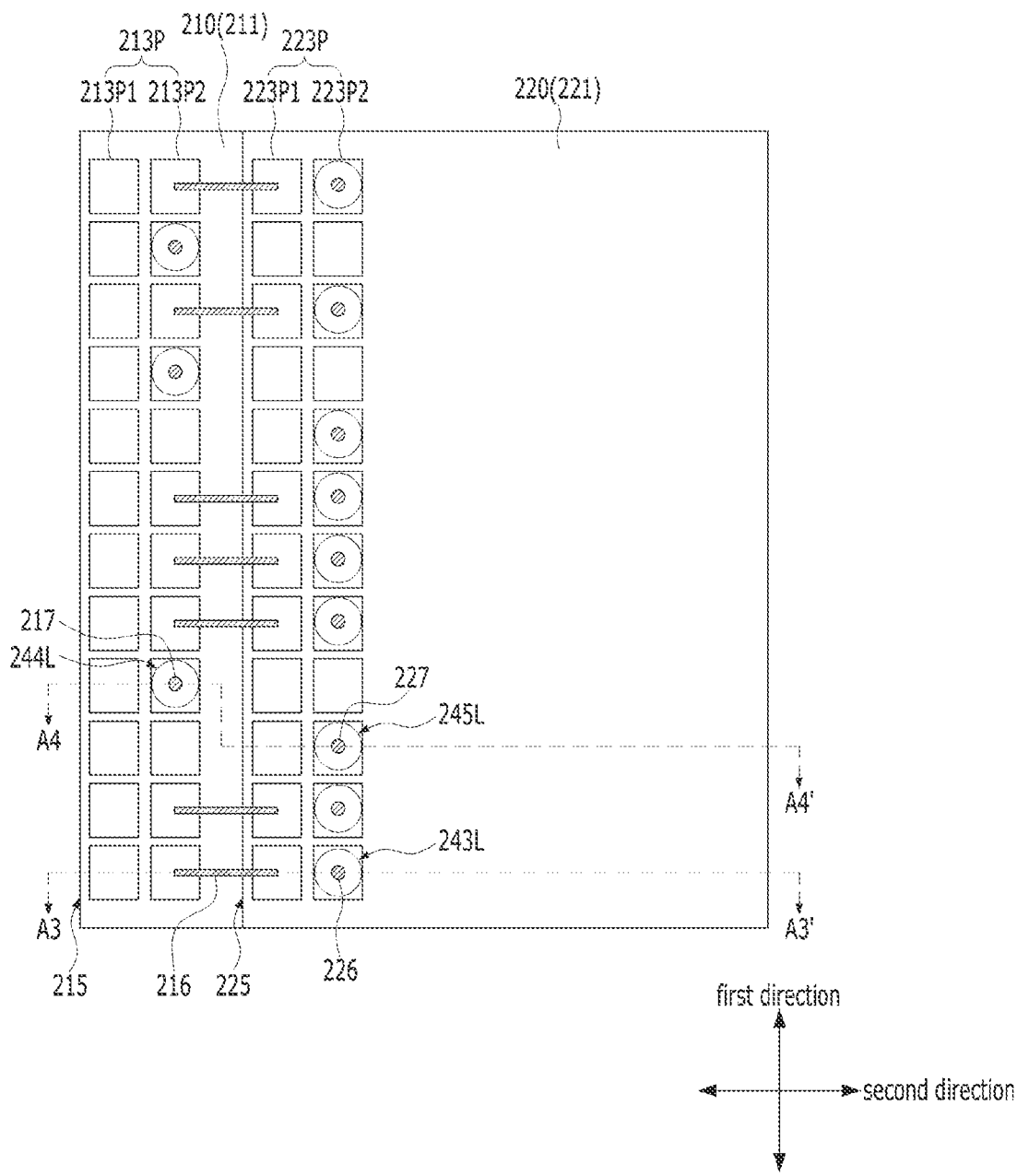
Figure 4B:
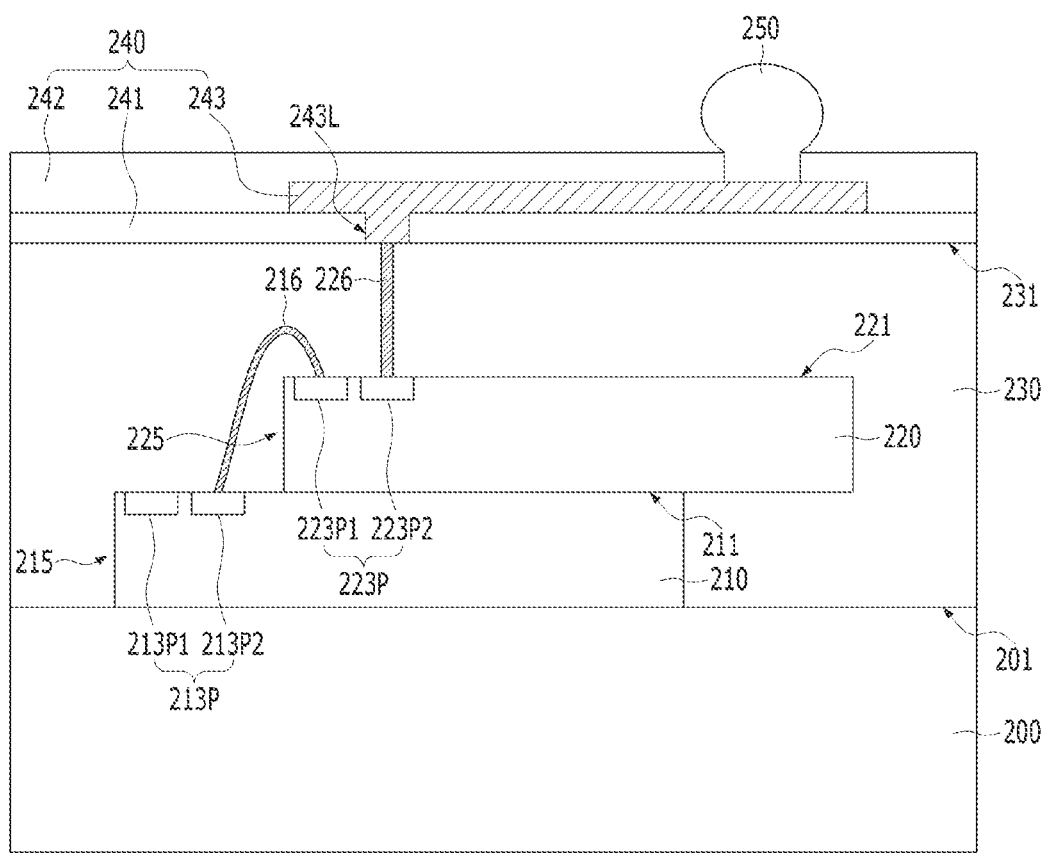
Figure 4C:
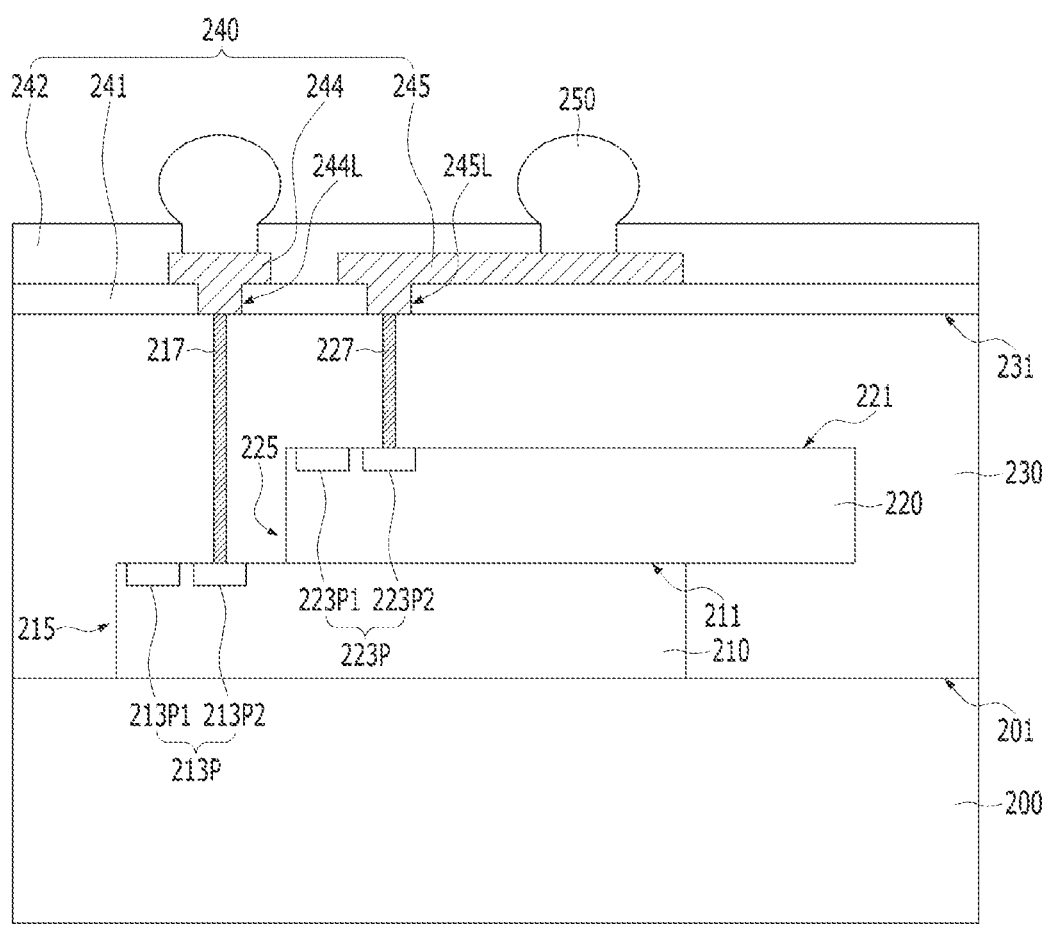

FIGS. 3A to 4C are views illustrating a semiconductor package and a method for fabricating the same, according to an embodiment of the present disclosure. For example, FIGS. 3A and 4A are plan views of the semiconductor package according to the embodiment of the present disclosure as viewed from an active surface direction. FIGS. 3B and 4B are cross-sectional views taken along a line A3-A3' of FIGS. 3A and 4A, respectively. FIGS. 3C and 4C are cross-sectional views taken along a line A4-A4' of FIGS. 3A and 4A, respectively. Detailed descriptions of parts that are substantially the same as those previously described in FIGS. 1A to 2B will be omitted.

First, the fabricating method will be described.

Referring to FIGS. 3A to 3C, a carrier substrate 200 may be provided. The carrier substrate 200 may be a glass carrier substrate, a silicon carrier substrate, a ceramic carrier substrate, or the like. Alternatively, the carrier substrate 200 may be a wafer, and a plurality of packages may be formed over the carrier substrate 200.

Subsequently, first and second semiconductor chips 210 and 220 may be stacked over a surface 201 of the carrier substrate 200 in a vertical direction with respect to the surface 201 of the carrier substrate 200. Each of the first and second semiconductor chips 210 and 220 may be substantially the same as the semiconductor chip 100 of the above-described embodiment.

Accordingly, the first semiconductor chip 210 may include chip pads 213P disposed on its active surface 211. The chip pads 213P may be arranged in two columns along a first direction in an edge region adjacent to a first side surface 215 of the first semiconductor chip 210, and may include a first column of first chip pads 213P1 and a second column of second chip pads 213P2. At this time, although not shown in this figure, the first and second chip pads 213P1 and 213P2 adjacent to each other in the second direction, that is, a pair of first and second chip pads 213P1 and 213P2 may be electrically connected to each other.

Similarly, the second semiconductor chip 220 may include chip pads 223P disposed on its active surface 221. The chip pads 223P may be arranged in two columns along the first direction in an edge region adjacent to a first side surface 225 of the second semiconductor chip 220, and may include a first column of first chip pads 223P1 and a second column of second chip pads 223P2. At this time, although not shown in this figure, the first and second chip pads 223P1 and 223P2 adjacent to each other in the second direction, that is, a pair of first and second chip pads 223P1 and 223P2 may be electrically connected to each other.

The first and second semiconductor chips 210 and 220 may be stacked over the carrier substrate 200 in a state in which the active surfaces 211 and 221 face upward rather than toward the surface 201 of the carrier substrate 200, that is, a face-up type. Although not shown, an adhesive layer may be formed over a surface of the first and second semiconductor chips 210 and 220, which is opposite to the active surfaces 211 and 221. By the adhesive layer, the first semiconductor chip 210 may be attached to the carrier substrate 200, the second semiconductor chip 220 may be attached to the first semiconductor chip 210.

In addition, in a state in which the first side surfaces 215 and 225 are parallel to each other and disposed to face the same side, for example, to face a left side in the second direction, the first and second semiconductor chips 210 and 220 may be stacked with a predetermined offset in a predetermined direction so that the edge region of the first semiconductor chip 210, which is adjacent to the first side surface 215, is exposed. Therefore, the chip pads 213P may be exposed. Here, the predetermined direction may be a direction toward an opposite side of the first side surfaces 215 and 225, for example, a right direction in the second direction. Because the second semiconductor chip 220 is positioned at the uppermost portion, the chip pads 223P may be exposed. The word "predetermined" as used herein with respect to a parameter, such as a predetermined direction and predetermined offset, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Subsequently, in order to electrically connect the first and second semiconductor chips 210 and 220 with an external component, interconnectors 216, 226, 217, and 227 connected to the chip pads 213P and 223P may be formed. Prior to the description of the interconnectors 216, 226, 217, and 227, a signal or power transmitted between the first and second semiconductor chips 210 and 220 and the external component will be described as follows.

As an example, a signal or power commonly used in the first semiconductor chip 210 and the second semiconductor chip 220 may exist. For example, when the first semiconductor chip 210 and the second semiconductor chip 220 are memory chips such as a NAND flash memory, a common signal such as a data input/output (DQ) signal, a command address (CA) signal, or the like may be commonly transmitted to the first and second semiconductor chips 210 and 220. Further, common power such as a ground voltage, or another voltage having the same level in the first and second semiconductor chips 210 and 220, may be commonly applied to the first and second semiconductor chips 210 and 220. Accordingly, the chip pads 213P and 223P of the first and second semiconductor chips 210 and 220 to which the common signal or common power is applied may be electrically connected to each other.

On the other hand, a signal or power separately used in each of the first and second semiconductor chips 210 and 220 may exist. For example, when the first semiconductor chip 210 and the second semiconductor chip 220 are memory chips such as a NAND flash memory, a chip select (CS) signal, a calibration input (ZQ) signal, or the like may be separately transmitted to each of the first and second semiconductor chips 210 and 220. In addition, when voltages of different levels are required to be applied to the first and second semiconductor chips 210 and 220, respectively, these voltages may be separately applied to the first and second semiconductor chips 210 and 220. Accordingly, the chip pads 213P of the first semiconductor chip 210 to which an individual signal or individual power is applied may be electrically separated from the chip pads 223P of the second semiconductor chip 220 to which the individual signal or individual power is applied.

Among the interconnectors 216, 226, 217, and 227, interconnectors connected to the chip pads 213P and 223P to which the common signal or common power is applied will be referred to as common interconnectors 216 and 226. The common interconnectors 216 and 226 will be described with reference to FIGS. 3A and 3B. The common interconnectors 216 and 226 may include a horizontal common interconnector 216 and a vertical common interconnector 226. The horizontal common interconnector 216 may connect the chip pad 213P of the first semiconductor chip 210 and the chip pad 223P of the second semiconductor chip 220 to each other, and thus, at least a portion of the horizontal common interconnector 216 may extend in a horizontal direction. The vertical common interconnector 226 may be electrically connected to the chip pad 223P of the second semiconductor chip 220 and extend in the vertical direction.

As an example, one end of the horizontal common interconnector 216 may be connected to the second chip pad 213P2 of the first semiconductor chip 210, and the other end of the horizontal common interconnector 216 may be connected to the first chip pad 223P1 of the second semiconductor chip 220. The second chip pad 213P2 of the first semiconductor chip 210 and the first chip pad 223P1 of the second semiconductor chip 220, which are connected to one horizontal common interconnector 216, may be adjacent to each other in the second direction, or may be located on a straight line in the second direction. In this case, a length of the horizontal common interconnector 216 may be the shortest, and thus, signal/power transmission through the horizontal common interconnector 216 may be facilitated. The horizontal common interconnector 216 may be a bonding wire having both ends connected to the chip pads 213P and 223P, respectively.

In addition, as an example, the vertical common interconnector 226 may extend in the vertical direction while having one end connected to the second chip pad 223P2 of the second semiconductor chip 220. In this case, the second chip pad 223P2 of the second semiconductor chip 220 to which the vertical common interconnector 226 is connected may be electrically connected to the first chip pad 223P1 of the second semiconductor chip 220 to which the horizontal common interconnector 216 is connected. The vertical common interconnector 226 may be a vertical bonding wire having one end connected to the second chip pad 223P2 of the second semiconductor chip 220. For reference, the method of forming the vertical bonding wire will be briefly described as follows. One end of a wire may be bonded to a chip pad using a wire bonding machine (not shown). The wire may include a metal such as gold, silver, copper, platinum, or an alloy thereof that can be welded to the chip pad by ultrasonic energy and/or heat. The wire bonding machine may then be used to pull the other end of the wire in a vertical direction away from the chip pad, for example from bottom to top. Subsequently, when the other end of the wire is extended to a desired position, the other end of the wire may be cut. Thereby, a vertical bonding wire may be obtained.

Accordingly, an electrical connection path passing through the second chip pad 213P2 of the first semiconductor chip 210, the horizontal common interconnector 216, the first chip pad 223P1 of the second semiconductor chip 220, and the vertical common interconnector 226, may be formed. That is, a path for commonly transmitting a signal and/or power to the first and second semiconductor chips 210 and 220, may be formed.

On the other hand, among the interconnectors 216, 226, 217, and 227, interconnectors connected to the chip pads 213P and 223P to which the individual signal or individual power is applied will be referred to as a first vertical interconnector 217 and a second vertical interconnector 227, respectively. The first and second vertical interconnectors 217 and 227 will be described with reference to FIGS. 3A and 3C.

As an example, the first vertical interconnector 217 may be a vertical bonding wire extending in the vertical direction, and may have one end connected to the chip pad 213P of the first semiconductor chip 210. The first vertical interconnector 217 may be connected to the chip pad 213P, except for the second chip pad 213P2 connected to the horizontal common interconnector 216 and the first chip pad 213P1 electrically connected thereto. Furthermore, the first vertical interconnector 217 may be connected to the chip pad 213P on which a probe test is not performed. When a probe test is performed on a chip pad, a surface of the chip pad may be deformed due to contact with the probe. For this reason, a process of performing wire bonding to this chip pad on which the probe test has been performed may be difficult. In particular, because only one end of a vertical wire is bonded to a chip pad, a wire bonding process may be more important. Accordingly, by connecting the first vertical interconnector 217 to the chip pads 213P that has not been in contact with the probe, defects in the wire bonding process may be reduced. In the present embodiment, a probe test may be performed on the first chip pads 213P1 and 223P1 in the first columns. Accordingly, the first vertical interconnector 217 may be connected to the second chip pads 213P2 of the first semiconductor chip 210, which is not connected to the horizontal common interconnector 216. In an embodiment, a deformation of a surface of a chip pad may be considered as any variation from the chip pad's original form caused by a probe test. In an embodiment, a deformation of a surface of a chip pad may be considered as any variation from the chip pad's original form caused by a probe.

In addition, as an example, the second vertical interconnector 227 may be a vertical bonding wire extending in the vertical direction, and may have one end connected to the chip pad 223P of the second semiconductor chip 220. The second vertical interconnector 227 may be connected to the chip pad 223P, except for the chip pads 223P to which the horizontal common interconnector 216 and the vertical common interconnector 226 are connected. Furthermore, the second vertical interconnector 227 may be connected to the chip pad 223P on which a probe test is not performed. In the present embodiment, a probe test may be performed on the first chip pads 213P1 and 223P1 in the first columns. Accordingly, the second vertical interconnector 227 may be connected to the second chip pad 223P2 of the second semiconductor chip 220, which is not connected to the vertical common interconnector 226.

An electrical connection path passing through the chip pad 213P of the first semiconductor chip 210 and the first vertical interconnector 217 may be separated from an electrical connection path passing through the chip pad 223P of the second semiconductor chip 220 and the second vertical interconnector 227. That is, a path for transmitting a signal and/or power to the first semiconductor chip 210 and a path for transmitting a signal and/or power to the second semiconductor chip 220 may be separated from each other.

Meanwhile, although not shown, a vertical interconnector connected to the second semiconductor chip 220 positioned at the uppermost portion, that is, the vertical common interconnector 226 and the second vertical interconnector 227, may be a different type of interconnectors instead of bonding wires. As an example, the vertical common interconnector 226 and the second vertical interconnector 227 may include metal bumps.

Next, referring to FIGS. 4A to 4C, a molding layer 230 on which the first and second semiconductor chips 210 and 220 and the interconnectors 216, 226, 217 and 227 are formed, may be formed over the carrier substrate 200.

The molding layer 230 may be formed using a molding process in which an empty space of a molding die (not shown) is filled with a molding material and the molding material is cured. The molding material may include a thermosetting resin such as EMC (Epoxy Mold Compound). The molding layer 230 may cover the first and second semiconductor chips 210 and 220 and the interconnectors 216, 226, 217, and 227 while exposing the other end of the first vertical interconnector 217, the other end of the vertical common interconnector 226, and the other end of the second vertical interconnector 227. The other ends may be, for example, upper ends. To this end, the molding layer 230 may be formed to a thickness sufficiently covering the first and second semiconductor chips 210 and 220 and the interconnectors 216, 226, 217, and 227, and then, a grinding process to the molding layer 230 may be performed. The grinding process may be performed by mechanical polishing or chemical polishing. Alternatively, instead of performing the grinding process, by adjusting shapes of the first vertical interconnector 217, the vertical common interconnector 226, and the second vertical interconnector 227 and/or a shape of the molding die, the other ends of the first vertical interconnector 217, the vertical common interconnector 226, and the second vertical interconnector 227 may be exposed.

Accordingly, the molding layer 230 may have a surface 231 which is positioned at substantially the same level as the other ends of the first vertical interconnector 217, the vertical common interconnector 226, and the second vertical interconnector 227, and exposing them.

Subsequently, a package redistribution layer 240 may be formed over the surface 231 of the molding layer 230. In order to distinguish the package redistribution layer 240 from the redistribution conductive layer (see 110 in FIGS. 2A and 2B) provided in the semiconductor chip described above, it is referred to as the package redistribution layer 240.

The package redistribution layer 240 may include package redistribution conductive layers 243, 244, and 245 electrically connected to the first vertical interconnector 217, the vertical common interconnector 226, and the second vertical interconnector 227. The package redistribution conductive layer 243 electrically connected to the vertical common interconnector 226 will be referred to as a first package redistribution conductive layer 243. A portion of the first package redistribution conductive layer 243 that overlaps and connects with the other end of the vertical common interconnector 226 will be referred to as a first redistribution land 243L. The package redistribution conductive layer 244 electrically connected to the first vertical interconnector 217 will be referred to as a second package redistribution conductive layer 244. A portion of the second package redistribution conductive layer 244 that overlaps and connects with the other end of the first vertical interconnector 217 will be referred to as a second redistribution land 244L. The package redistribution conductive layer 245 electrically connected to the second vertical interconnector 227 will be referred to as a third package redistribution conductive layer 245. A portion of the third package redistribution conductive layer 245 that overlaps and connects with the other end of the second vertical interconnector 227 will be referred to as a third redistribution land 245L.

The package redistribution layer 240 may further include a first package redistribution insulating layer 241 and a second package redistribution insulating layer 242.

The first package redistribution insulating layer 241 may cover the surface 231 of the molding layer 230, and may have openings exposing the other ends of the first vertical interconnector 217, the vertical common interconnector 226, and the second vertical interconnector 227, respectively. The package redistribution conductive layers 243, 244, and 245 may be patterned to have various shapes over the first package redistribution insulating layer 241 while filling these openings. Portions of the package redistribution conductive layers 243, 244, and 245 filled in these openings may form the first to third redistribution lands 243L, 244L, and 245L described above. For convenience of description, in the plan view of FIG. 4A, the overall shape of the package redistribution conductive layers 243, 244, and 245 is omitted, and only the first to third redistribution lands 243L, 244L, and 245L are illustrated. The second package redistribution insulating layer 242 may cover the first package redistribution insulating layer 241 and the package redistribution conductive layers 243, 244, 245, and may have openings to expose portions of the package redistribution conductive layers 243, 244, 245.

Subsequently, external connection terminals 250 electrically connected to the package redistribution conductive layers 243, 244, 245 through the openings of the second package redistribution insulating layer 242 may be formed over the package redistribution layer 240. In the present embodiment, a solder ball may be used as the external connection terminal 250, but the present disclosure is not limited thereto, and various types of electrical connectors may be used as the external connection terminal 250.

Accordingly, an electrical connection path passing through the second chip pad 213P2 of the first semiconductor chip 210, the horizontal common interconnector 216, the first chip pad 223P1 of the second semiconductor chip 220 and the second chip pad 223P2 electrically connected thereto, the vertical common interconnector 226, the first package redistribution conductive layer 243, and the external connection terminal 250 connected thereto, may be formed. That is, a signal and/or power may be commonly transmitted between the first and second semiconductor chips 210 and 220 and an external component (not shown) to be connected to the external connection terminal 250. In addition, an electrical connection path passing through the second chip pad 213P2 of the first semiconductor chip 210, the first vertical interconnector 217, the second package redistribution conductive layer 244, and an external connection terminal 250 connected the second package redistribution conductive layer 244, may be formed. That is, a signal and/or power may be transmitted only between the first semiconductor chip 210 and an external component (not shown) to be connected to the external connection terminal 250. In addition, an electrical connection path passing through the second chip pad 223P2 of the second semiconductor chip 220, the second vertical interconnector 227, the third package redistribution conductive layer 245, and the external connection terminal 250 connected to the third package redistribution conductive layer 245, may be formed. That is, a signal and/or power may be transmitted only between the second semiconductor chip 220 and an external component (not shown) to be connected to the external connection terminal 250.

Although not shown, the carrier substrate 200 may be removed in a subsequent process. The carrier substrate 200 may be removed at any time after the molding layer 230 is formed.

By the processes described above, the semiconductor package as shown in FIGS. 4A and 4B may be fabricated. Components of the semiconductor package have already been described in describing the fabricating method, and thus detailed descriptions thereof will be omitted.

According to the semiconductor package and its fabricating method of the present embodiment, the following effects may be obtained.

First, the demand for high performance and high-volume data processing may be satisfied by forming the semiconductor package including the first and second semiconductor chips 210 and 220, and the semiconductor package having a thin thickness may be implemented by forming a fan-out package using the package redistribution layer 240 and the vertical interconnectors 226, 217, and 227, instead of using a conventional substrate.

In addition, compared to a comparative example in which all of chip pads of first and second semiconductor chips are connected with vertical interconnectors, the chip pads 213P and 223P to which a signal or power commonly used for the first and second semiconductor chips 210 and 220 is applied, may be connected to each other through the horizontal common interconnector 216, and thus the number of vertical interconnectors 226, 217, 227 may decrease and spaces between the vertical interconnectors 226, 217, 227 may increase. That is, in the semiconductor package of the present embodiment, a density of the vertical interconnectors 226, 217, and 227 may be reduced. In this case, compared to the comparative example, crosstalk between the vertical interconnectors 226, 217, and 227 may be reduced, and the use of a metal material for forming wires may be reduced, thereby reducing cost. Furthermore, compared to the comparative example, the degree of freedom in design of the package redistribution layer 240 may be increased. In particular, because sizes of the first to third redistribution lands 243L, 244L, and 245L can be increased, misalignments with the first to third redistribution lands 243L, 244L, and 245L caused by sweeping of the vertical interconnectors 226, 217, 227, and defects resulting therefrom may also be reduced.

For reference, a sweeping phenomenon of a vertical bonding wire used as the vertical interconnectors 226, 217, and 227 will be described with reference to FIG. 5 as follows.

Figure 5:
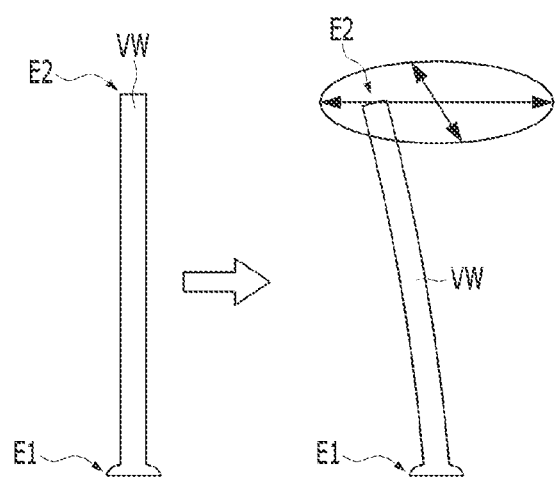
FIG. 5 is a view illustrating a sweeping phenomenon of a vertical bonding wire.

FIG. 5 is a view illustrating a sweeping phenomenon of a vertical bonding wire.

Referring to FIG. 5, a vertical bonding wire VW may have one end E1 that is attached to a chip pad and the other end E2 that is located on the opposite side thereof.

The left side of an arrow shows a state immediately after the vertical bonding wire VW is formed. The vertical bonding wire VW may maintain a state of substantially 90 degree verticality as long as no external force is applied.

The right side of the arrow shows a state after an external force, such as pressure, is applied to the vertical bonding wire VW through a flow of a molding material during a molding process. When the pressure is applied, the one end E1 of the vertical bonding wire VW is not moved because the one end E1 is fixed to the chip pad. However, because the other end E2 of the vertical bonding wire VW is not fixed and moves according to the direction in which the pressure is applied, sweeping of the vertical bonding wire VW may occur. That is, the vertical bonding wire VW may be bent. As a result of the sweeping, the other end E2 of the vertical bonding wire VW may be displaced to a random position within a range of a circle that is illustrated in FIG. 5, for example. The displacement of the other end E2 of the vertical bonding wire VW may be changed by a vortex of the molding material, which is caused by the injection direction and pressure of the molding material and the surrounding structure. The larger the length of the vertical bonding wire VW, the more severe the sweeping. In the case of the sweeping of the vertical bonding wire VW, a short problem with an adjacent vertical bonding wire, a problem in which the connection between the vertical bonding wire VW and the chip pad is disconnected, or the like, may occur. Further, because the position of the other end E2 of the vertical bonding wire VW is changed, components to be connected to the other end E2 of the vertical bonding wire VW, for example, the lands of the package redistribution conductive layers (refer to 243L, 244L, and 245L in FIG. 4A) may be misaligned with the other end E2 of the vertical wire VW. As a result, a connection failure between the vertical bonding wire VW and the package redistribution conductive layer may occur.

Returning to the explanation of the effect of the present embodiment, the decrease in the number/density of the vertical interconnectors 226, 217, and 227 may mean the decrease in the number/density of the lands 243L, 244L, and 245L to be connected with the vertical interconnectors 226, 217, and 227. Therefore, the sizes of the lands 243L, 244L, 245L may be increased, and thus the misalignments between the vertical interconnectors 226, 217, and 227 and the lands 243L, 244L, and 245L may be reduced even if the sweeping of the vertical interconnectors 226, 217, and 227 occurs.

In particular, the sweeping phenomenon may be more problematic in the first vertical interconnector 217, which is connected to the first semiconductor chip 210 located at a lowermost portion and has a relatively long length. However, the number/density of the first vertical interconnectors 217 may be smaller than the number/density of the vertical common interconnectors 226 and the second vertical interconnectors 227 connected to the second semiconductor chip 220. Therefore, even if the size of the second redistribution land 244L connected to the first vertical interconnector 217 is increased, a short between the adjacent second redistribution lands 244L might not occur. Also, as the size of the second redistribution land 244L increases, the degree of misalignment between the first vertical interconnector 217 and the second redistribution land 244L may be further reduced.

The planar sizes of the first to third redistribution lands 243L, 244L, and 245L may have a value equal to or greater than a displacement of the other end of the vertical common interconnector 226, a displacement of the other end of the first vertical interconnector 217, and a displacement of the other end of the second vertical interconnector 227, respectively.

Meanwhile, in the embodiment of FIGS. 3A to 4C described above, a case in which two semiconductor chips 210 and 220 are offset-stacked in a predetermined direction has been described. However, in another embodiment, three or more semiconductor chips may be offset-stacked in a predetermined direction. This will be described, for example, with reference to FIGS. 6A to 6C below.

Figure 6B:
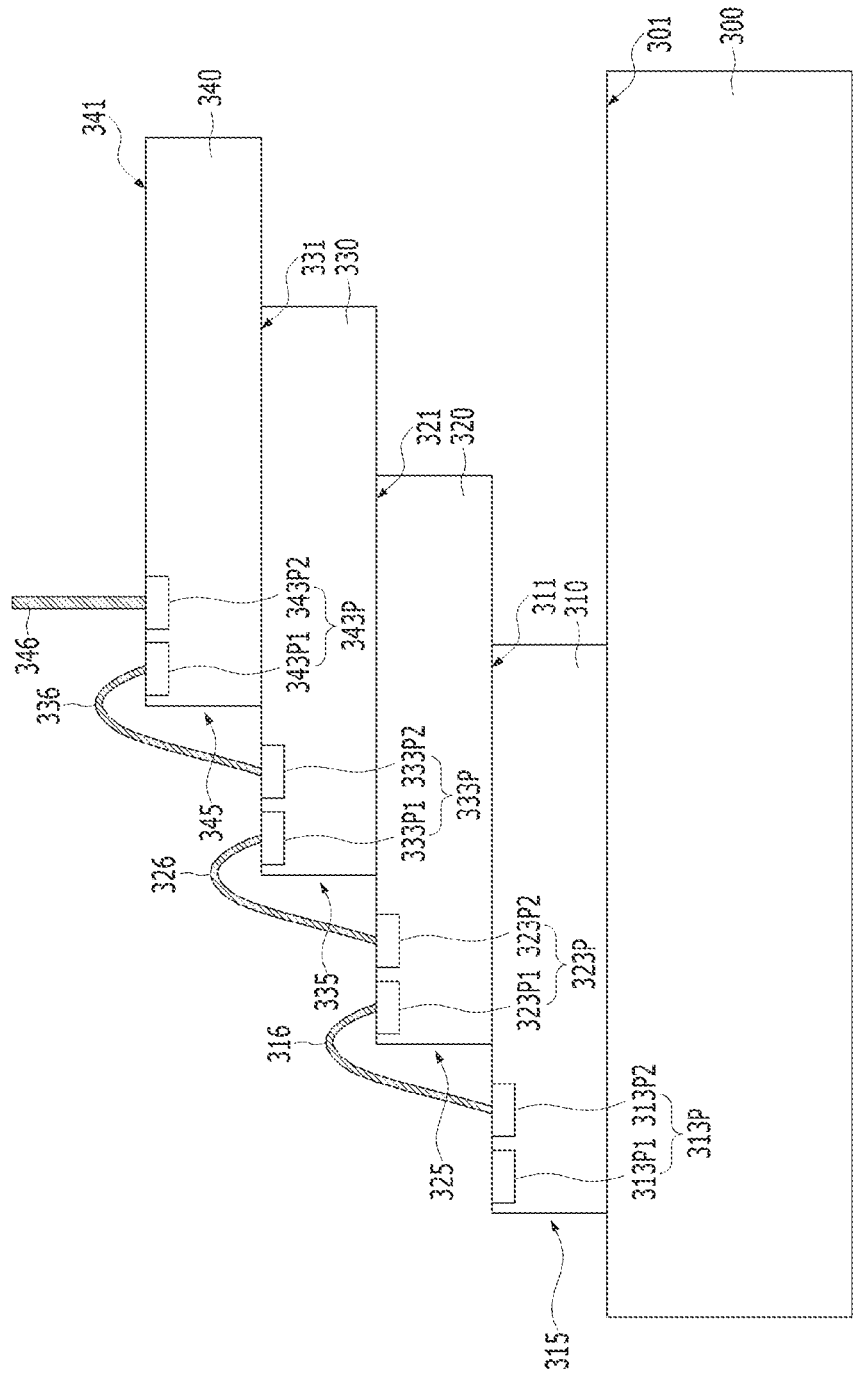
FIG. 6B is a cross-sectional view taken along a line B1-B1' of FIG. 6A.
Figure 6C:
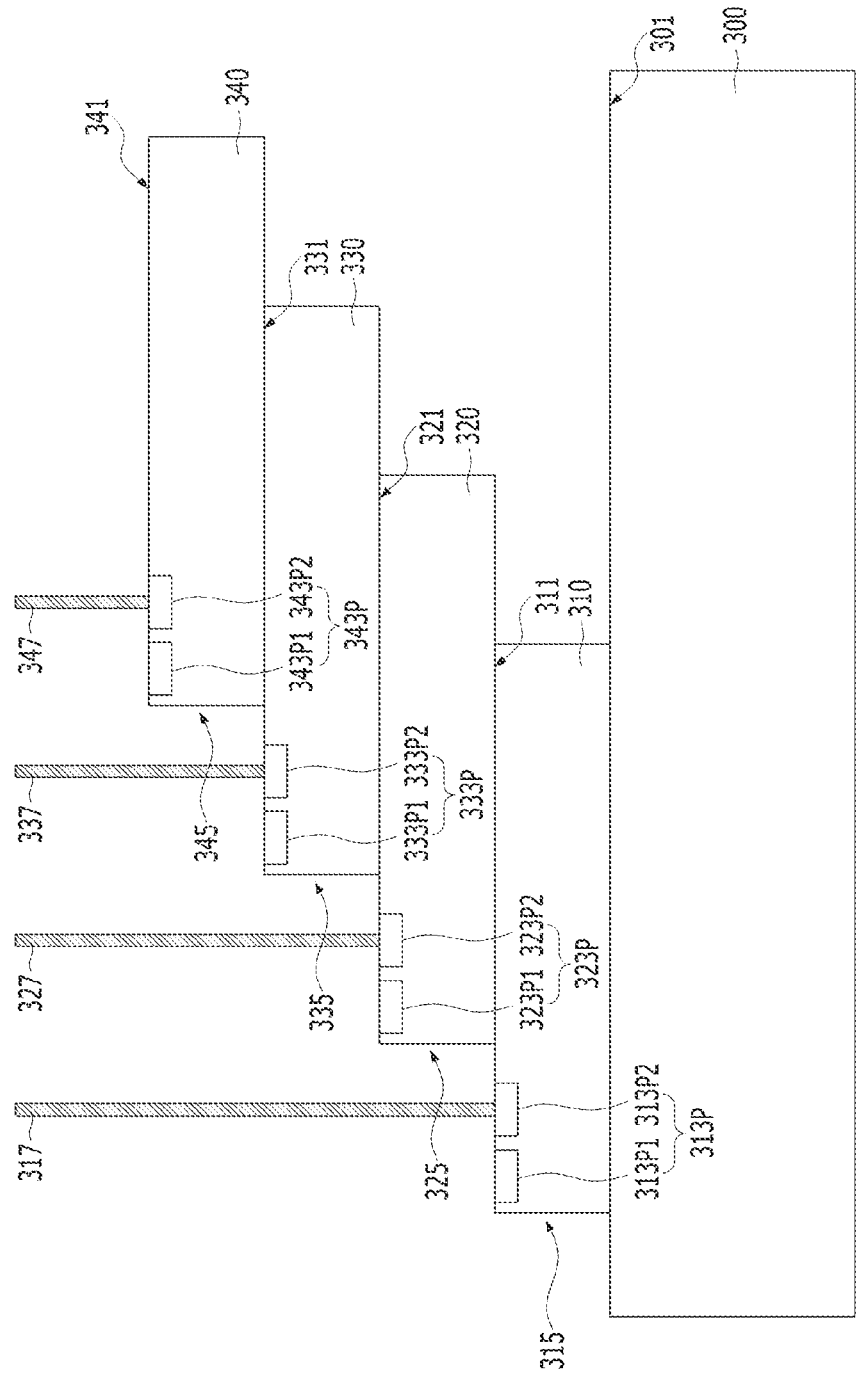
FIG. 6C is a cross-sectional view taken along a line B2-B2' of FIG. 6A.

FIGS. 6A to 6C are views illustrating a semiconductor package and a method for fabricating the same according to another embodiment of the present disclosure. For example, FIG. 6A is a plan view of the semiconductor package according to another embodiment of the present disclosure as viewed from an active surface direction. FIG. 6B is a cross-sectional view taken along a line B1-B1' of FIG. 6A. FIG. 6C is a cross-sectional view taken along a line B2-B2' of FIG. 6A. Detailed descriptions of parts that are substantially the same as those previously described in FIGS. 1A to 4C will be omitted.

Referring to FIGS. 6A to 6C, first to fourth semiconductor chips 310, 320, 330, and 340 may be vertically stacked over a surface 301 of a carrier substrate 300. The first semiconductor chip 310 may include chip pads 313P disposed on an active surface 311. The chip pads 313P may be arranged in two columns along a first direction in an edge region adjacent to a first side surface 315 of the first semiconductor chip 310, and include a first column of first chip pads 313P1 and a second column of second chip pads 313P2. The first and second chip pads 313P1 and 313P2 adjacent to each other in a second direction, that is, a pair of first and second chip pads 313P1 and 313P2 may be electrically connected to each other. Similarly, the second semiconductor chip 320 may include chip pads 323P disposed on an active surface 321. The chip pads 323P may be arranged in two columns along the first direction in an edge region adjacent to a first side surface 325 of the second semiconductor chip 320, and may include a first column of first chip pads 323P1 and a second column of second chip pads 323P2. A pair of first and second chip pads 323P1 and 323P2 may be electrically connected to each other. Similarly, the third semiconductor chip 330 may include chip pads 333P disposed on an active surface 331. The chip pads 333P may be arranged in two columns along the first direction in an edge region adjacent to a first side surface 335 of the third semiconductor chip 330, and may include a first column of first chip pads 333P1 and a second column of second chip pads 333P2. A pair of first and second chip pads 333P1 and 333P2 may be electrically connected to each other. Similarly, the fourth semiconductor chip 340 may include chip pads 343P disposed on an active surface 341. The chip pads 343P may be arranged in two columns along the first direction in an edge region adjacent to a first side surface 345 of the fourth semiconductor chip 340, and may include a first column of first chip pads 343P1 and a second column of second chip pads 343P2. A pair of first and second chip pads 343P1 and 343P2 may be electrically connected to each other.

Here, the first to fourth semiconductor chips 310, 320, 330, and 340 may be stacked over the carrier substrate 300 in a state in which the active surfaces 311, 321, 331, and 341 face upward rather than toward the surface 301 of the carrier substrate 300, that is, in a face-up type.

In addition, in a state in which the first side surfaces 315, 325, 335, and 345 are parallel to each other and disposed to face the same side, for example, to face the left side in the second direction, the first to fourth semiconductor chips 310, 320, 330, and 340 may be offset-stacked in a predetermined direction to expose the edge regions adjacent to the first side surfaces 315, 325, 335, and 345, that is, the chip pads 313P, 323P, and 333P, and 343P. Here, the predetermined direction may be a direction away from the first side surfaces 315, 325, 335, and 345, for example, a right direction in the second direction.

Subsequently, interconnectors 316, 326, 336, 346, 317, 327, 337, and 347 connected to the chip pads 313P, 323P, 333P, and 343P may be formed.

Among the interconnectors 316, 326, 336, 346, 317, 327, 337, and 347, common interconnectors 316, 326, 336, and 346 may be connected to the chip pads 313P, 323P, 333P, and 343P to which a common signal or common power is applied. The common interconnectors 316, 326, 336, and 346 will be described with reference to FIGS. 6A and 6B. The common interconnectors 316, 326, 336, and 346 may include a first horizontal common interconnector 316 which connects the chip pad 313P of the first semiconductor chip 310 and the chip pad 323P of the second semiconductor chip 320 to each other, a second horizontal common interconnector 326 which connects the chip pad 323P of the second semiconductor chip 320 and the chip pad 333P of the third semiconductor chip 330 to each other, a third horizontal common interconnector 336 which connects the chip pad 333P of the third semiconductor chip 330 and the chip pad 343P of the fourth semiconductor chip 340 to each other, and a vertical common interconnector 346 electrically connected to the chip pad 343P of the fourth semiconductor chip 340 and extending in a vertical direction.

As an example, one end and the other end of the first horizontal common interconnector 316 may be connected to the second chip pad 313P2 of the first semiconductor chip 310 and the first chip pad 323P1 of the second semiconductor chip 320, respectively. One end and the other end of the second horizontal common interconnector 326 may be connected to the second chip pad 323P2 of the second semiconductor chip 320 and the first chip pad 333P1 of the third semiconductor chip 330, respectively. One end and the other end of the third horizontal common interconnector 336 may be connected to the second chip pad 333P2 of the third semiconductor chip 330 and the first chip pad 343P1 of the fourth semiconductor chip 340, respectively. The chip pads 313P2, 323P1, 323P2, 333P1, 333P2, and 343P1, which are connected to the first to third horizontal common interconnectors 316, 326, and 336, may be located adjacent to each other on a straight line in the second direction. The first to third horizontal common interconnectors 316, 326, and 336 may be bonding wires.

In addition, as an example, the vertical common interconnector 346 may extend in the vertical direction while having one end connected to the second chip pad 343P2 of the fourth semiconductor chip 340. Here, the second chip pad 343P2 of the fourth semiconductor chip 340 to which the vertical common interconnector 346 is connected, may be electrically connected to the first chip pad 343P1 of the fourth semiconductor chip 340 to which the third horizontal common interconnector 336 is connected. The vertical common interconnector 346 may be a vertical bonding wire.

Accordingly, an electrical connection path passing through the second chip pad 313P2 of the first semiconductor chip 310, the first horizontal common interconnector 316, the first chip pad 323P1 of the second semiconductor chip 320 and the second chip pad 323P2 electrically connected thereto, the second horizontal common interconnector 326, the first chip pad 333P1 of the third semiconductor chip 330 and the second chip pad 333P2 electrically connected thereto, the third horizontal common interconnector 336, the first chip pad 343P1 of the fourth semiconductor chip 340 and the second chip pad 343P2 electrically connected thereto, and the vertical common interconnector 346, may be formed. That is, a path for transmitting a signal and/or power in common to the first to fourth semiconductor chips 310, 320, 330, and 340, may be formed.

On the other hand, among the interconnectors 316, 326, 336, 346, 317, 327, 337, and 347, first to fourth vertical interconnectors 317, 327, 337, and 347 may be connected to the chip pads 313P, 323P, 333P, and 343P to which an individual signal or individual power is applied. The first to fourth vertical interconnectors 317, 327, 337, and 347 will be described with reference to FIGS. 6A and 6C.

As an example, the first vertical interconnector 317 may be connected to the chip pad 313P, except for the second chip pad 313P2 connected to the first horizontal common interconnector 316. Furthermore, the first vertical interconnector 317 may be connected to the chip pad 313P, for example, the second chip pad 313P2, on which the probe test is not performed. Similarly, the second vertical interconnector 327 may be connected to the chip pad 323P, except for the chip pad 323P connected to the first and second horizontal common interconnectors 316 and 326. Furthermore, the second vertical interconnector 327 may be connected to the chip pad 323P, for example, the second chip pad 323P2, on which the probe test is not performed. Similarly, the third vertical interconnector 337 may be connected to the chip pad 333P, except for the chip pad 333P connected to the second and third horizontal common interconnectors 326 and 336. Furthermore, the third vertical interconnector 337 may be connected to the chip pad 333P, for example, the second chip pad 333P2, on which the probe test is not performed. Similarly, the fourth vertical interconnector 347 may be connected to the chip pad 343P, except for the chip pad 343P connected to the third horizontal common interconnector 336 and the vertical common interconnector 346. Furthermore, the fourth vertical interconnector 347 may be connected to the chip pad 343P, for example, the second chip pad 343P2, on which the probe test is not performed.

An electrical connection path passing through the chip pad 313P of the first semiconductor chip 310 and the first vertical interconnector 317, an electrical connection path passing through the chip pad 323P of the second semiconductor chip 320 and the second vertical interconnector 327, an electrical connection path passing through the chip pad 333P of the third semiconductor chip 330 and the third vertical interconnector 337, and an electrical connection path passing through the chip pad 343P of the fourth semiconductor chip 340 and the fourth vertical interconnector 347, may be separated from each other. That is, a path for transmitting a signal and/or power to the first semiconductor chip 310, a path for transmitting a signal and/or power to the second semiconductor chip 320, a path for transmitting a signal and/or power to the third semiconductor chip 330, and a path for transmitting a signal and/or power to the fourth semiconductor chip 340, may be separated from each other.

Meanwhile, although not shown, the vertical interconnectors connected to the fourth semiconductor chip 340 positioned at the uppermost portion, that is, the vertical common interconnector 346 and the fourth vertical interconnector 347, may be a different type of connectors, instead of bonding wires. As an example, the vertical common interconnector 346 and the fourth vertical interconnector 347 may include metal bumps.

Although not shown, a molding layer and a package redistribution layer may be formed over the resultant structure of FIGS. 6A to 6C. Lands of the package redistribution conductive layer may overlap and connect with the other end of each of the vertical common interconnector 346 and the first to fourth vertical interconnectors 317, 327, 337, and 347, respectively.

Even in the case of the present embodiment, all the effects of the above-described embodiment may be achieved. In particular, compared to the number/density of the vertical interconnectors 346 and 347 connected to the fourth semiconductor chip 340 positioned at the uppermost portion, the number/density of vertical interconnectors 317 connected to the first semiconductor chip 310, the number/density of the vertical interconnectors 327 connected to the second semiconductor chip 320, and the number/density of the vertical interconnectors 337 connected to the third semiconductor chip 330 may be smaller. That is, because the number/density of the relatively long length vertical interconnectors 317, 327, and 337, which have a problem of sweeping, is small, the size of the land connected to the vertical interconnectors 317, 327, and 337 may be increased. As a result, misalignments between the vertical interconnectors 317, 327, and 337 and the lands may be reduced.

Furthermore, compared to the above-described embodiment, because the number of semiconductor chips included in one semiconductor package is increased, high-volume data processing/high performance of the semiconductor package may be further satisfied.

Meanwhile, in the embodiments of FIGS. 3A to 6C above, a case in which a plurality of semiconductor chips are offset-stacked in one direction has been described. In this case, the plurality of semiconductor chips may be integrally recognized as one semiconductor chip. That is, a one-channel semiconductor package may be implemented. However, in other embodiments, a semiconductor package having two or more channels may be implemented. This will be described, for example, with reference to FIGS. 7A to 7C below.

Figure 7A:
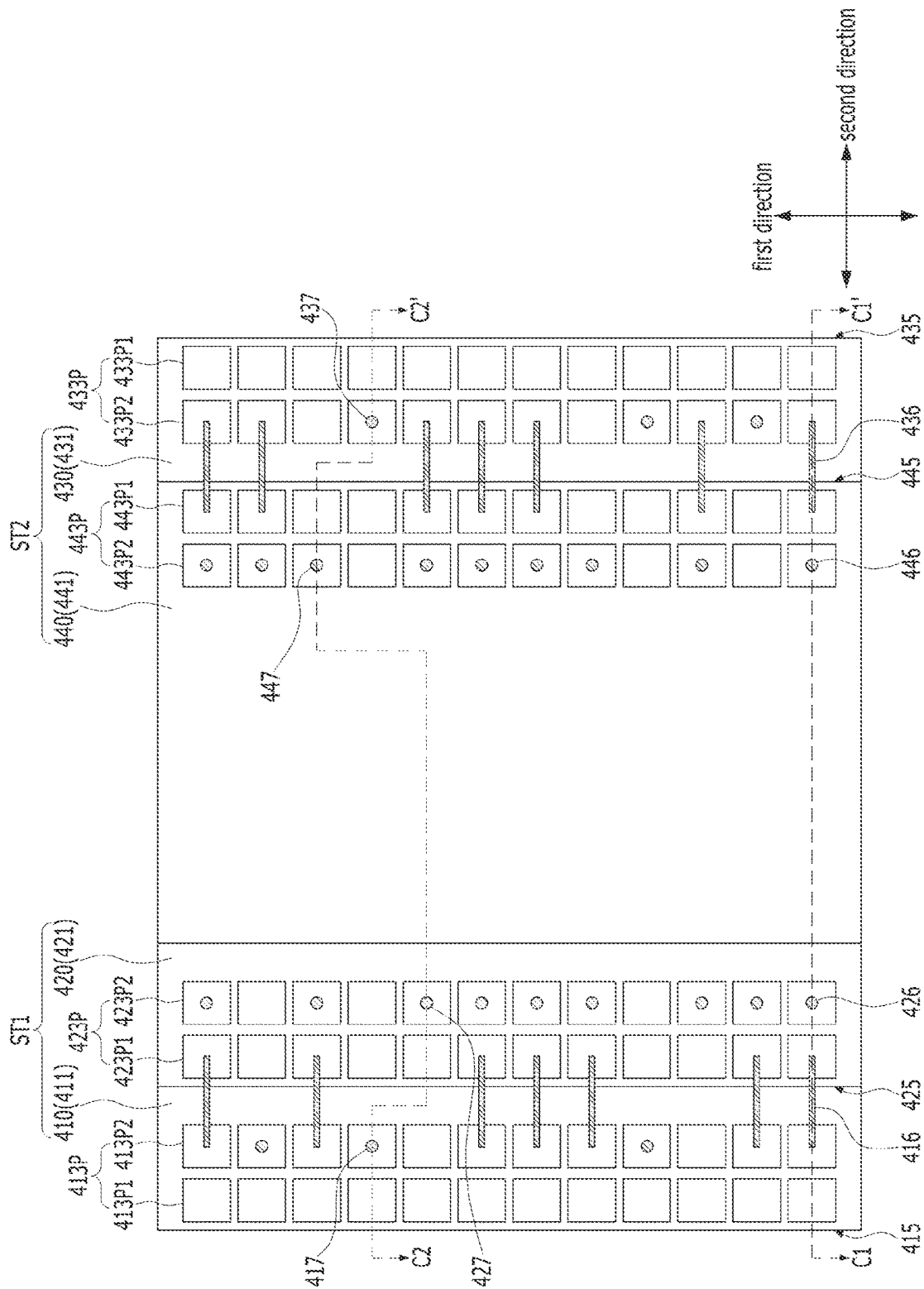
FIG. 7A is a plan view of a semiconductor package according to another embodiment of the present disclosure as viewed from an active surface direction.
Figure 7B:
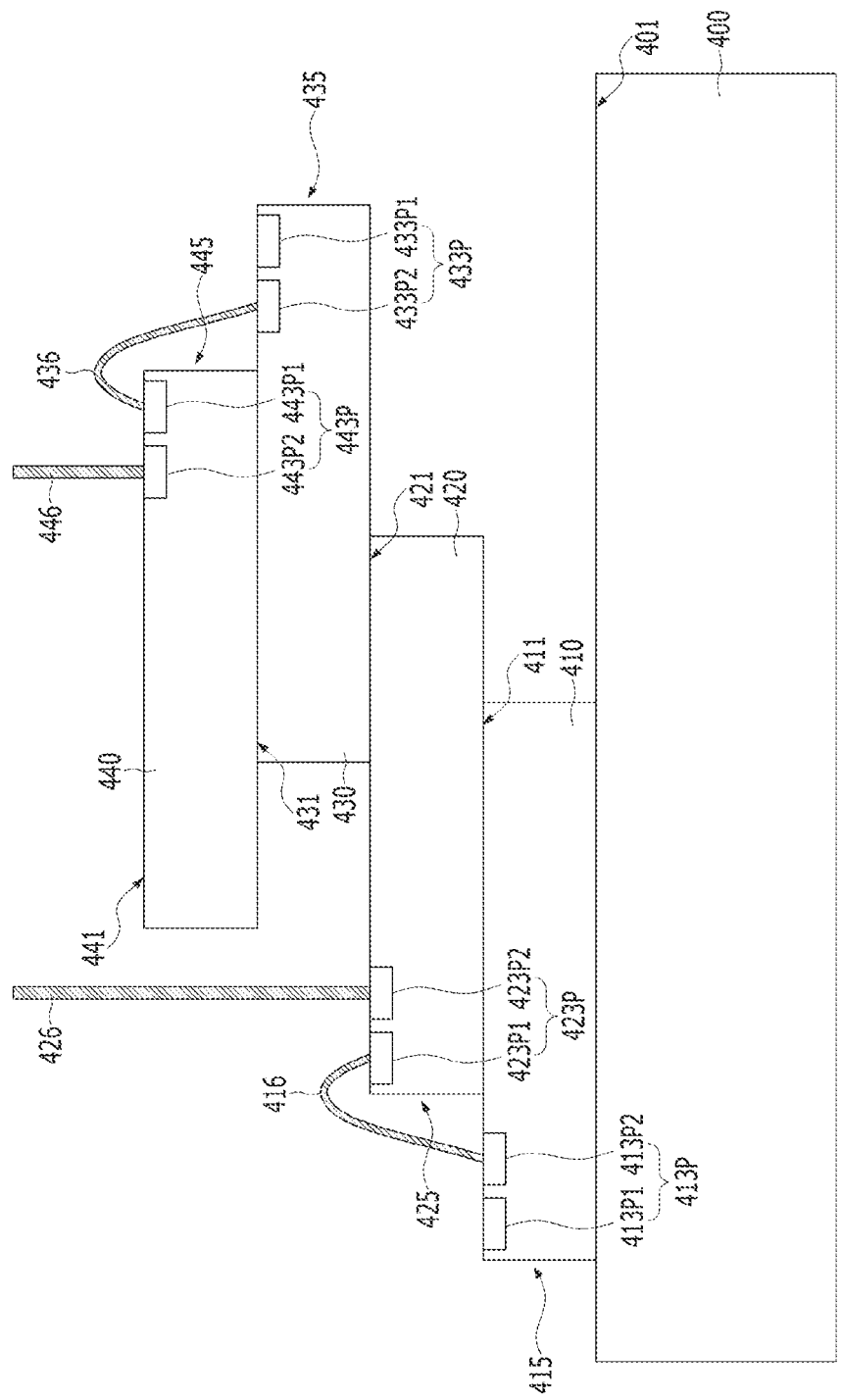
FIG. 7B is a cross-sectional view taken along a line C1-C1' of FIG. 7A.
Figure 7C:
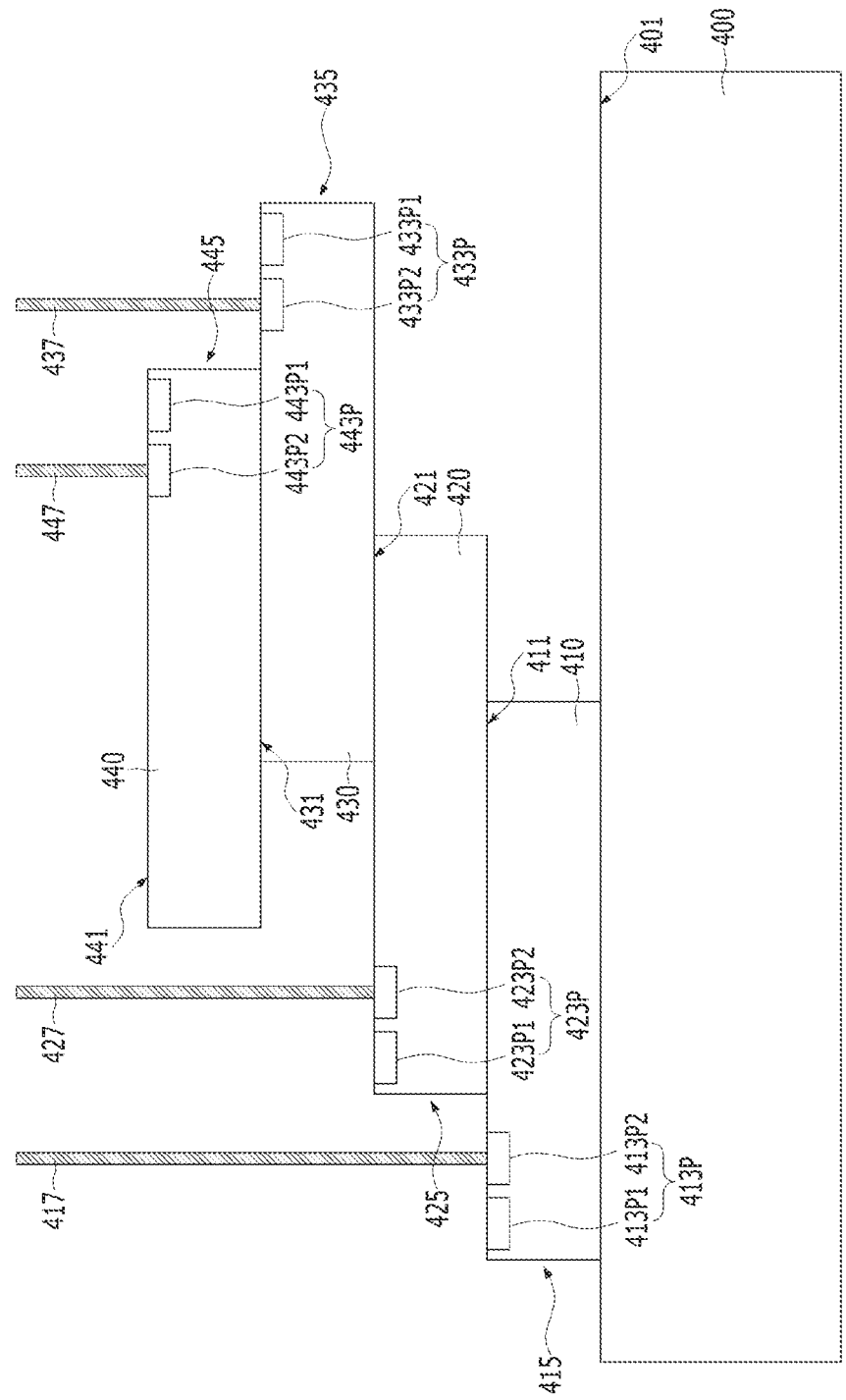
FIG. 7C is a cross-sectional view taken along a line C2-C2' of FIG. 7A.

FIGS. 7A to 7C are views illustrating a semiconductor package and a method for fabricating the same, according to another embodiment of the present disclosure. Specifically, FIG. 7A is a plan view of a semiconductor package according to another embodiment of the present disclosure as viewed from an active surface direction. FIG. 7B is a cross-sectional view taken along a line C1-C1' of FIG. 7A. FIG. 7C is a cross-sectional view taken along a line C2-C2' of FIG. 7A. Detailed descriptions of parts that are substantially the same as those previously described in FIGS. 1A to 4C and FIGS. 6A to 6C will be omitted.

Referring to FIGS. 7A to 7C, first to fourth semiconductor chips 410, 420, 430, and 440 may be vertically stacked over a surface 401 of a carrier substrate 400. The first semiconductor chip 410 may include chip pads 413P disposed on an active surface 411. The chip pads 413P may be arranged in two columns along a first direction in an edge region adjacent to a first side surface 415 of the first semiconductor chip 410, and include a first column of first chip pads 413P1 and a second column of second chip pads 413P2. The first and second chip pads 413P1 and 413P2 adjacent to each other in a second direction, that is, a pair of first and second chip pads 413P1 and 413P2 may be electrically connected to each other. Similarly, the second semiconductor chip 420 may include chip pads 423P disposed on an active surface 421. The chip pads 423P may be arranged in two columns along the first direction in an edge region adjacent to a first side surface 425 of the second semiconductor chip 420, and may include a first column of first chip pads 423P1 and a second column of second chip pads 423P2. A pair of first and second chip pads 423P1 and 423P2 may be electrically connected to each other. Similarly, the third semiconductor chip 430 may include chip pads 433P disposed on an active surface 431. The chip pads 433P may be arranged in two columns along the first direction in an edge region adjacent to a first side surface 435 of the third semiconductor chip 430, and may include a first column of first chip pads 433P1 and a second column of second chip pads 433P2. A pair of first and second chip pads 433P1 and 433P2 may be electrically connected to each other. Similarly, the fourth semiconductor chip 440 may include chip pads 443P disposed on an active surface 441. The chip pads 443P may be arranged in two columns along the first direction in an edge region adjacent to a first side surface 445 of the fourth semiconductor chip 440, and may include a first column of first chip pads 443P1 and a second column of second chip pads 443P2. A pair of first and second chip pads 443P1 and 443P2 may be electrically connected to each other.

Here, the first to fourth semiconductor chips 410, 420, 430, and 440 may be stacked over the carrier substrate 400 in a state in which the active surfaces 411, 421, 431, and 441 face upward rather than toward the surface 401 of the carrier substrate 400, that is, in a face-up type.

In addition, in a state in which the first side surfaces 415 and 425 are parallel to each other and disposed to face the same side, for example, to face the left side in the second direction, the first and second semiconductor chips 410 and 420 may be offset-stacked in a predetermined direction to expose the edge region adjacent to the first side surface 415 of the first semiconductor chip 410, that is, the chip pads 413P of the first semiconductor chip 410. Here, the predetermined direction may be a direction away from the first side surface 415, for example, a right direction in the second direction. On the other hand, in a state in which the first side surfaces 435 and 445 are parallel to each other and disposed to face the same side, which is opposite to the first side surfaces 415 and 425 of the first and second semiconductor chips 410 and 420, for example, to face the right side in the second direction, the third and fourth semiconductor chips 430 and 440 may be offset-stacked in a predetermined direction to expose the edge region adjacent to the first side surface 435 of the third semiconductor chip 430, that is, the chip pads 433P of the third semiconductor chip 430. Here, the predetermined direction may be a direction opposite to the offset stacking direction of the first and second semiconductor chips 410 and 420, for example, a left direction in the second direction. Because the fourth semiconductor chip 440 is positioned at the uppermost portion, the chip pads 443P of the fourth semiconductor chip 440 may be exposed. Furthermore, the third and fourth semiconductor chips 430 and 440 may be stacked to expose the chip pads 423P of the second semiconductor chip 420.

The first chip stack ST1 including the first and second semiconductor chips 410 and 420 offset-stacked in one direction may be recognized as one semiconductor chip, and the second chip stack ST2 including the third and fourth semiconductor chips 430 and 440 offset-stacked in the opposite direction may be recognized as another semiconductor chip different from the first chip stack ST1. A signal/power path through the first chip stack ST1 may be electrically separated from a signal/power path through the second chip stack ST2. Also, the signal/power path through the first chip stack ST1 may be recognized separately from the signal/power path through the second chip stack ST2. Therefore, hereinafter, the first chip stack ST1 and the second chip stack ST2 will be separately described.

The first chip stack ST1 and interconnectors 416, 426, 417, and 427 electrically connected thereto may be substantially the same as the structures of FIGS. 3A to 3C described above.

Specifically, Among the interconnectors 416, 426, 417, and 427, common interconnectors 416 and 426 may be connected to the chip pads 413P and 423P to which a common signal or common power is applied. The common interconnectors 416 and 426 may include a horizontal common interconnector 416 and a vertical common interconnector 426. One end and the other end of the horizontal common interconnector 416 may be connected to the second chip pad 413P2 of the first semiconductor chip 410 and the first chip pad 423P1 of the second semiconductor chip 420, respectively. The vertical common interconnector 426 may extend in the vertical direction while having one end connected to the second chip pad 423P2 of the second semiconductor chip 420.

Also, among the interconnectors 416, 426, 417, and 427, first and second vertical interconnectors 417 and 427 may be connected to the chip pads 413P and 423P to which an individual signal or individual power is applied. The first vertical interconnector 417 may be connected to the chip pad 413P, except for the second chip pad 413P2 connected to the horizontal common interconnector 416 and the first chip pad 413P1 electrically connected thereto. Furthermore, the first vertical interconnector 417 may be connected to the chip pad 413P, for example, the second chip pad 413P2, on which the probe test is not performed. The second vertical interconnector 427 may be connected to the chip pad 423P, except for the first chip pad 423P1 connected to the horizontal common interconnector 416 and the second chip pad 423P2 connected to the vertical common interconnector 426. Furthermore, the second vertical interconnector 427 may be connected to the chip pad 423P, for example, the second chip pad 423P2, on which the probe test is not performed.

Interconnectors 436, 446, 437, and 447 electrically connected to the second chip stack ST2 will be described below.

For example, among the interconnectors 436, 446, 437, and 447, common interconnectors 436 and 446 may be connected to the chip pads 433P and 443P to which a common signal or common power is applied. The common interconnectors 436 and 446 may include a horizontal common interconnector 436 and a vertical common interconnector 446. One end and the other end of the horizontal common interconnector 446 may be connected to the second chip pad 443P2 of the third semiconductor chip 430 and the first chip pad 443P1 of the fourth semiconductor chip 440, respectively. The vertical common interconnector 446 may extend in the vertical direction while having one end connected to the second chip pad 443P2 of the fourth semiconductor chip 440.

Also, among the interconnectors 436, 446, 437, and 447, third and fourth vertical interconnectors 437 and 447 may be connected to the chip pads 433P and 443P to which an individual signal or individual power is applied. The third vertical interconnector 437 may be connected to the chip pad 433P, except for the second chip pad 433P2 connected to the horizontal common interconnector 436 and the first chip pad 433P1 electrically connected thereto. Furthermore, the third vertical interconnector 437 may be connected to the chip pad 433P, for example, the second chip pad 433P2, on which the probe test is not performed. The fourth vertical interconnector 447 may be connected to the chip pad 443P, except for the first chip pad 443P1 connected to the horizontal common interconnector 436 and the second chip pad 443P2 connected to the vertical common interconnector 446. Furthermore, the fourth vertical interconnector 447 may be connected to the chip pad 443P, for example, the second chip pad 443P2, on which the probe test is not performed.

The second chip stack ST2 and the interconnectors 436, 446, 437, and 437 electrically connected thereto may be substantially the same as a state in which the first chip stack ST1 and the interconnectors 416, 426, 417, and 427 electrically connected thereto are rotated 180 degrees about one axis in the vertical direction.

Meanwhile, although not shown, the vertical interconnectors connected to the fourth semiconductor chip 440 positioned at the uppermost portion, that is, the vertical common interconnector 446 and the fourth vertical interconnector 447, may be a different type of connectors, instead of bonding wires. As an example, the vertical common interconnector 446 and the fourth vertical interconnector 447 may include metal bumps.

Although not shown, a molding layer and a package redistribution layer may be formed over the resultant structure of FIGS. 7A to 7C. Lands of the package redistribution conductive layer may overlap and connect with the other end of each of the vertical common interconnectors 426 and 446, and the first to fourth vertical interconnectors 417, 427, 437, and 447, respectively.

Even in the case of the present embodiment, all the effects of the above-described embodiment may be achieved.

Furthermore, compared to the above-described embodiment, because the number of semiconductor chips included in one semiconductor package is increased, high-volume data processing/high performance of the semiconductor package may be further satisfied. Furthermore, Because the first chip stack ST1 and the second chip stack ST2 are recognized as different semiconductor chips, a semiconductor package functioning as two channels may be implemented.

According to the above embodiments of the present disclosure, it may be possible to provide a semiconductor package with a thin thickness while satisfying the demand for high performance/high volume. In addition, it may be possible to provide a semiconductor package that can reduce defects caused by a process and increase design freedom.

Figure 8:
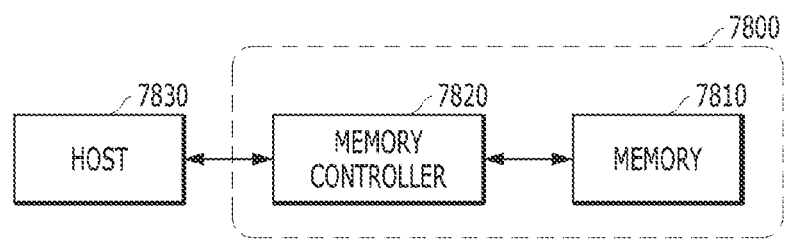
FIG. 8 shows a block diagram illustrating an electronic system employing a memory card including a semiconductor package, according to an embodiment.

FIG. 8 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 9:
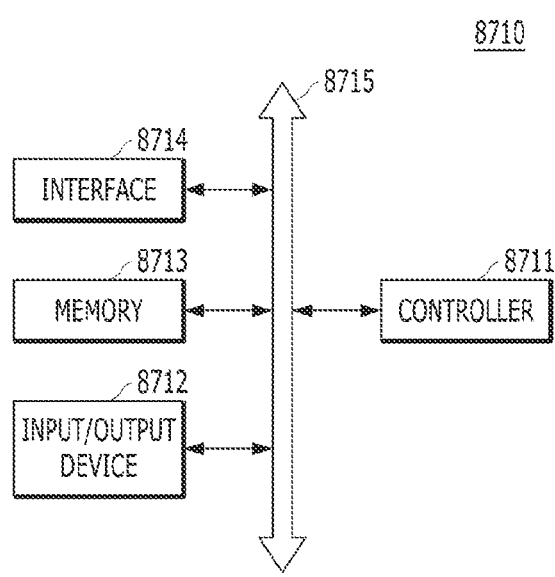
FIG. 9 shows a block diagram illustrating another electronic system including a semiconductor package, according to an embodiment.

FIG. 9 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the present teachings as defined in the following claims.

What is claimed is:

1. A semiconductor package, comprising:
a first chip stack including first and second semiconductor chips which have first side surfaces extending in a first direction, and are offset-stacked toward an opposite side of the first side surfaces of the first and second semiconductor chips to expose edge regions adjacent to the first side surfaces of the first and second semiconductor chips;

a second chip stack formed over the first chip stack and including third and fourth semiconductor chips which have first side surfaces located substantially opposite to the first side surfaces of the first and second semiconductor chips, and are offset-stacked in a direction substantially opposite to an offset stacking direction of the first and second semiconductor chips to expose edge regions adjacent to the first side surfaces of the third and fourth semiconductor chips;

chip pads disposed in each of the edge regions of the first to fourth semiconductor chips, the chip pads including a plurality of first chip pads arranged in a first column along the first direction and a plurality of second chip pads arranged in a second column along the first direction, the first column being closer to the first side surface than the second column in a second direction crossing the first direction, and the first and second chip pads which are adjacent in the second direction being electrically connected to each other;

a first horizontal common interconnector having one end connected to the second chip pad of the first semiconductor chip, and an other end connected to the first chip pad of the second semiconductor chip;

a second horizontal common interconnector having one end connected to the second chip pad of the third semiconductor chips, and an other end connected to the first chip pad of the fourth semiconductor chip;

a first vertical common interconnector having one end connected to the second chip pad of the second semiconductor chip, wherein the second chip pad of the second semiconductor chip is electrically connected to the first chip pad of the second semiconductor chip connected to the first horizontal common interconnector; and a second vertical common interconnector having one end connected to the second chip pad of the fourth semiconductor chip, wherein the second chip pad of the fourth semiconductor chip is electrically connected to the first chip pad of the fourth semiconductor chip connected to the second horizontal common interconnector.

2. The semiconductor package according to claim 1, further comprising:

first to fourth vertical interconnectors respectively connected to the first to fourth semiconductor chips, each of the first to fourth vertical interconnectors having one end connected to the first chip pad or the second chip pad, which is not connected to the first and second horizontal common interconnectors and the first and second vertical common interconnectors.

3. The semiconductor package according to claim 2, wherein:

power or a signal applied through the first vertical interconnector connected to the first semiconductor chip is electrically separated from power or a signal applied through the second vertical interconnector connected to the second semiconductor chip, and power or a signal applied through the third vertical interconnector connected to the third semiconductor chip is electrically separated from power or a signal applied through the fourth vertical interconnector connected to the fourth semiconductor chip.

4. The semiconductor package according to claim 2, wherein each of the first and second vertical common interconnectors, the first and second horizontal common interconnectors, and the first to fourth vertical interconnectors includes a bonding wire.

5. The semiconductor package according to claim 2, wherein each of the first and second horizontal common interconnectors, the first vertical common interconnector, and the first to fourth vertical interconnectors includes a bonding wire, and each of the second vertical common interconnector and the fourth vertical interconnector includes a bump.

6. The semiconductor package according to claim 2, further comprising:

a molding layer covering the first to fourth semiconductor chips and exposing an other end of each of the first and second vertical common interconnectors and the first to fourth vertical interconnectors; and a package redistribution layer formed over the molding layer and electrically connected to the other end of each of the first and second vertical common interconnectors and the first to fourth vertical interconnectors.

7. The semiconductor package according to claim 2, wherein the second chip stack, and the second horizontal common interconnector, the second vertical common interconnector, and the third and fourth vertical interconnectors electrically connected to the second chip stack, are the same as a state in which the first chip stack, and the first horizontal common interconnector, the first vertical common interconnector, and the first and second vertical interconnectors electrically connected to the first chip stack, are rotated substantially 180 degrees centered on an axis in a vertical direction.

8. The semiconductor package according to claim 1, wherein:

power or a signal applied through the first vertical common interconnector and the first horizontal common interconnector is commonly used in the first and second semiconductor chips, and power or a signal applied through the second vertical common interconnector and the second horizontal common interconnector is commonly used in the third to fourth semiconductor chips.

9. The semiconductor package according to claim 1, wherein each of the first and second vertical common interconnectors and the first and second horizontal common interconnectors includes a bonding wire.

10. The semiconductor package according to claim 1, wherein each of the first and second horizontal common interconnectors and the first vertical common interconnector includes a bonding wire, and the second vertical common interconnector includes a bump.

11. The semiconductor package according to claim 1, wherein the second chip stack is disposed to expose the edge region of the first side surface of the second semiconductor chip.

* * * * *